United States Patent
Han et al.

(10) Patent No.: US 6,740,247 B1
(45) Date of Patent: May 25, 2004

(54) HF VAPOR PHASE WAFER CLEANING AND OXIDE ETCHING

(75) Inventors: Yong-Pil Han, Seoul (KR); Herbert H. Sawin, Chestnut Hill, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 09/498,303

(22) Filed: Feb. 4, 2000

Related U.S. Application Data
(60) Provisional application No. 60/118,937, filed on Feb. 5, 1999.

(51) Int. Cl.[7] .................... B44C 1/22; C03C 15/00; C03C 25/68; C23F 1/00; H01L 21/302
(52) U.S. Cl. .................................. 216/73; 438/743
(58) Field of Search .................... 216/73, 79, 80; 438/706, 743; 134/2, 31

(56) References Cited

U.S. PATENT DOCUMENTS

| | | |
|---|---|---|
| 4,127,437 A | 11/1978 | Bersin et al. |
| 4,264,374 A | 4/1981 | Beyer et al. |
| 4,605,479 A | 8/1986 | Faith, Jr. |
| 4,749,440 A | 6/1988 | Blackwood et al. |
| 4,806,171 A | 2/1989 | Whitlock et al. |
| 4,900,395 A | 2/1990 | Syverson et al. |
| 4,904,338 A | 2/1990 | Kozicki |
| 4,932,168 A | 6/1990 | Tada et al. |
| 5,006,795 A * | 4/1991 | Yoshizawa et al. ......... 324/751 |
| 5,025,597 A | 6/1991 | Tada et al. |
| 5,062,898 A | 11/1991 | McDermott et al. |
| 5,073,232 A | 12/1991 | Ohmi et al. |
| 5,078,832 A | 1/1992 | Tanaka |
| 5,089,084 A | 2/1992 | Chhabra et al. |
| 5,089,441 A | 2/1992 | Moslehi |
| 5,100,495 A | 3/1992 | Ohmi et al. |
| 5,112,437 A | 5/1992 | Watanabe et al. |
| 5,129,198 A | 7/1992 | Kanno et al. |
| 5,147,466 A | 9/1992 | Ohmori et al. |
| 5,167,761 A | 12/1992 | Westendorp et al. |

(List continued on next page.)

FOREIGN PATENT DOCUMENTS

| | | |
|---|---|---|
| EP | 0 288 263 | 10/1988 |
| EP | 0 602 633 | 6/1994 |
| EP | 0 732 733 | 9/1996 |
| JP | 08 316189 | 11/1996 |
| WO | WO 92 22084 | 12/1992 |
| WO | WO 94 27315 | 11/1994 |

OTHER PUBLICATIONS

Nakanishi et al., "Precise Control of SIO2 Etching Characteristics Using Mono–Layer Adsorption HF/H2O Vapor", Int. Conf. On Solid State Devices & Materials, Extended Abstracts, C–1–4, pp. 255–257, Aug. 1995.*

(List continued on next page.)

*Primary Examiner*—Gregory Mills
*Assistant Examiner*—Robert Culbert
(74) *Attorney, Agent, or Firm*—Theresa A. Lober

(57) ABSTRACT

The invention provides HF vapor process conditions that can be precisely controlled with a high degree of reproducibility for a wide range of starting wafer conditions. These HF vapor processes for, e.g., etching oxide on a semiconductor substrate, cleaning a contaminant on a semiconductor substrate, removing etch residue from a metal structure on a semiconductor substrate, and cleaning a metal contact region of a semiconductor substrate. In the HF vapor process, a semiconductor substrate having oxide, a contaminant, metal etch residue, or a contact region to be processed is exposed to hydrofluoric acid vapor and water vapor in a process chamber held at temperature and pressure conditions that are controlled to form on the substrate no more than a sub-monolayer of etch reactants and products produced by the vapor as the substrate is processed by the vapor. The sub-monolayer HF vapor process regime is defined in accordance with the invention to proceed under conditions wherein no more than about 95% of a monolayer of coverage of the substrate surface occurs.

10 Claims, 21 Drawing Sheets

U.S. PATENT DOCUMENTS

| | | |
|---|---|---|
| 5,173,152 A | 12/1992 | Tanaka |
| 5,174,855 A | 12/1992 | Tanaka |
| 5,209,028 A | 5/1993 | McDermott et al. |
| 5,238,500 A | 8/1993 | Bergman |
| 5,244,535 A | 9/1993 | Ohtsuka et al. |
| 5,268,069 A | 12/1993 | Chapple-Sokol et al. |
| 5,279,705 A | 1/1994 | Tanaka |
| 5,282,925 A * | 2/1994 | Jeng et al. .................... 216/59 |
| 5,288,333 A * | 2/1994 | Tanaka et al. ................ 134/31 |
| 5,294,261 A | 3/1994 | McDermott et al. |
| 5,294,568 A | 3/1994 | McNeilly et al. |
| 5,315,793 A | 5/1994 | Peterson et al. |
| 5,336,356 A * | 8/1994 | Ban et al. ............. 156/345.26 |
| 5,348,619 A | 9/1994 | Bohannon et al. |
| 5,357,991 A | 10/1994 | Bergman et al. |
| 5,372,652 A | 12/1994 | Srikrishnan et al. |
| 5,377,911 A | 1/1995 | Bauer et al. |
| 5,378,312 A | 1/1995 | Gifford et al. |
| 5,403,434 A | 4/1995 | Moslehi |
| 5,425,845 A | 6/1995 | Wong |
| 5,439,553 A | 8/1995 | Grant et al. |
| 5,456,758 A | 10/1995 | Menon |
| 5,512,106 A | 4/1996 | Tamai et al. |
| 5,567,332 A | 10/1996 | Mehta |
| 5,580,421 A | 12/1996 | Hiatt et al. |
| 5,584,963 A | 12/1996 | Takahashi |
| 5,589,422 A | 12/1996 | Bhat |
| 5,635,102 A | 6/1997 | Mehta |
| 5,651,834 A | 7/1997 | Jon et al. |
| 5,658,417 A | 8/1997 | Watanabe et al. |
| 5,662,772 A | 9/1997 | Scheiter et al. |
| 5,922,219 A * | 7/1999 | Fayfield et al. ............... 216/58 |
| 5,967,156 A * | 10/1999 | Rose et al. .................... 134/7 |
| 6,024,888 A * | 2/2000 | Watanabe et al. ............ 216/73 |
| 6,194,325 B1 * | 2/2001 | Yang et al. ................. 438/740 |

OTHER PUBLICATIONS

Peterson et al., "Contamination Removal by $CO_2$ Jet Spray," SPIE vol. 1329,*Optical System Contamination: Effects, Measurement, Control II*, pp. 72–85,1990.

Layden et al., "High velocity carbon dioxide snow for cleaning vacuum system surfaces," *J. Vac. Sci. Technol. A*, vol. 8, No. 5, pp. 3881–3883, Sep./Oct. 1990.

Izumi et al., "A New Cleaning Method by Using Anhydrous $HF/CH_3OH$ Vapor System," *Japanese Journal of Applied Physics*, Int. Conf. On Solid State Devices and Materials, pp. 135–137, Aug. 1991.

Wong et al., "Characterization of Wafer Cleaning and Oxide Etching Using Vapor–Phase Hydrogen Fluoride," *J. Electrochem. Soc.*, vol. 138, No. 6, pp. 1799–1802, Jun. 1991.

Syverson et al., "The Removal of Reactive Ion Etch Residues," Technical Report WC/DC/WS/R, TR 386, FSI International, Chaska, MN, May 10, 1993.

Syverson et al., "Post Metal Etch Residue Removal Using Vapor Phase Processing Tech.," Technical Report WC/DC/WS/R, TR 392, FSI International, Chaska, MN, May 24, 1993.

Gay et al., "Vapor Phase cleaning of Submicron Inter–Metal Vias," Technical Report DC/DE, TR 397, FSI International, Chaska, MN, Nov., 1993.

Bohannon et al., "Polysilicon Emitter Vapor Clean Characterization on an EXCALIBUR MVP," Technical Report DCSE, TR 393, FSI International, Chaska, MN, Nov. 10,1993.

Bohannon et al., "Titanium Salicide Vapor Clean Development on an EXCALIBUR MVP," Techincal Report DCSE, TR 394, FSI International, Chaska, MN, Nov. 10, 1993.

Werkhoven et al., "Cluster–Tool Integrated HF Vapor Etching For Native Oxide Free Processing," *Mat. Res. Soc. Symp. Proc.*, vol. 315, pp. 211–217, 1993.

Watanabe et al., "Influence of Water Adsorption/Desorption Processes on the Selectivity of Vapor HF Etching," *J. Electrochem. Soc.*, vol. 142, No. 4, pp. 1332–1340, Apr. 1995.

Tong et al., "The Removal of Polymeric/Silicate Residues and Reduction of Contact Resistance for Inter–metal Via Holes by Vapor Phase HF Cleaning," Surface Conditioning Systems Technical Report, Document No. 1024–TRS–1196, FSI International, Chaska, MN, Oct. 1996.

Allgair et al., "Nanoscale patterning of silicon dioxide thin films by catalyzed HF vapor etching," *Nanotechnology*, vol. 7, pp. 351–355, 1996.

Lee et al., "Dry Release for Surface Micromachining with HF Vapor–Phase Etching," *Journal of Microelectromechanical Systems*, vol. 6, No. 3, pp. 226–232, Sep. 1997.

Saito et al., "X–ray Photoelectron Study on the Adsorption of Anhydrous Hydrogen Fluoride onto Silicon Native Oxide," *Jpn J. Appl. Phys.*, vol. 36, Part 2, No. 11A, pp. L1466–L1469, Nov. 1997.

Habuka et al., "In situ cleaning method for silicon surface using hydrogen fluoride gas in a hydrogen ambient," *Journal of Crystal Growth*, vol. 186, pp. 104–112, 1998.

Nakazawa et al., "Selective Etching of Silicon Native Oxide with Remote–Plasma–Excited Anhydrous Hydrogen Fluoride," *Jpn. J. Appl. Phys.*, vol. 37, Part 2, No. 5A, pp. L537–538, May 1998.

Chang et al., "Anhydrous HF etch reduces processing steps for DRAM capacitors," *Solid State Technology*, pp. 71–76, May 1998.

Sherman et al., "The removal of hydrocarbons and silicone grease stains from silicon wafers," *J. Vac., Sci. Technol. B*, vol. 8, No. 3, pp. 563–567, May/Jun. 1990.

Philipossian, "The Activity of $HF/H_2O$ Treated Silicon Surfaces in Ambient Air Before and After Gate Oxidation," *Proc., Second Int. Symp. On Cleaning Technology in Semiconductor Device Manufacturing*, pp. 234–250, Oct. 1992.

Nakanishi et al., "Precise Control of $SiO_2$ Etching Characteristics Using Mono–Layer Adsorption of $Hf/H_2O$ Vapor," *Int. Conf. On Solid State Devices & Materials*, Extended Abstracts, C–1–4, pp. 255–257, Aug. 1995.

Patent Abstracts of Japan, vol. 1997, No. 03, & JP 08316189A, Hitachi Ltd., Mar. 1997.

Han et al., "Characterization of Silicon Oxide Etching and Cleaning in HF Vapor Process," *Meeting Abstracts, Fifth Int. Symp. On Cleaning Technology in Semiconductor Device Manufacturing*, ECS, Paris, France, Aug. 1997.

Han et al., "Characterization of Silicon Oxide Etching and Cleaning in HF Vapor Process," *Proceedings, Cleaning Technology in Semiconductor Device Manufacturing V*, Novak et al., Editors, Feb. 27, 1998.

Han et al., "Etching and Cleaning of Silicon Wafers using HF Vapor Process in the Non–condensed Etching Regime," Abstract, *American Vacuum Society National Meeting*, Baltimore, MD, Nov. 1998.

Han et al., "Characterization of Silicon Oxide Etching in HF Vapor Process," Abstract, *American Vacuum Society National Meeting*, San Jose, CA, Nov. 1997.

Han, "HF Vapor Etching and Cleaning of Silicon Wafer Surfaces," Ph.D. Thesis, Massachusetts Institute of Technology, Cambridge, MA, Jul. 1999.

Kwon, "Post Oxide Etching Cleaning Process Using Integrated Ashing and HF Vapor Process," Masters Thesis, Massachusetts Institute of Technology, Cambridge, MA, May 1999.

* cited by examiner

● REACTANTS
○ PRODUCTS

● REACTANTS
○ PRODUCTS

● REACTANTS
○ PRODUCTS

● REACTANTS
○ PRODUCTS

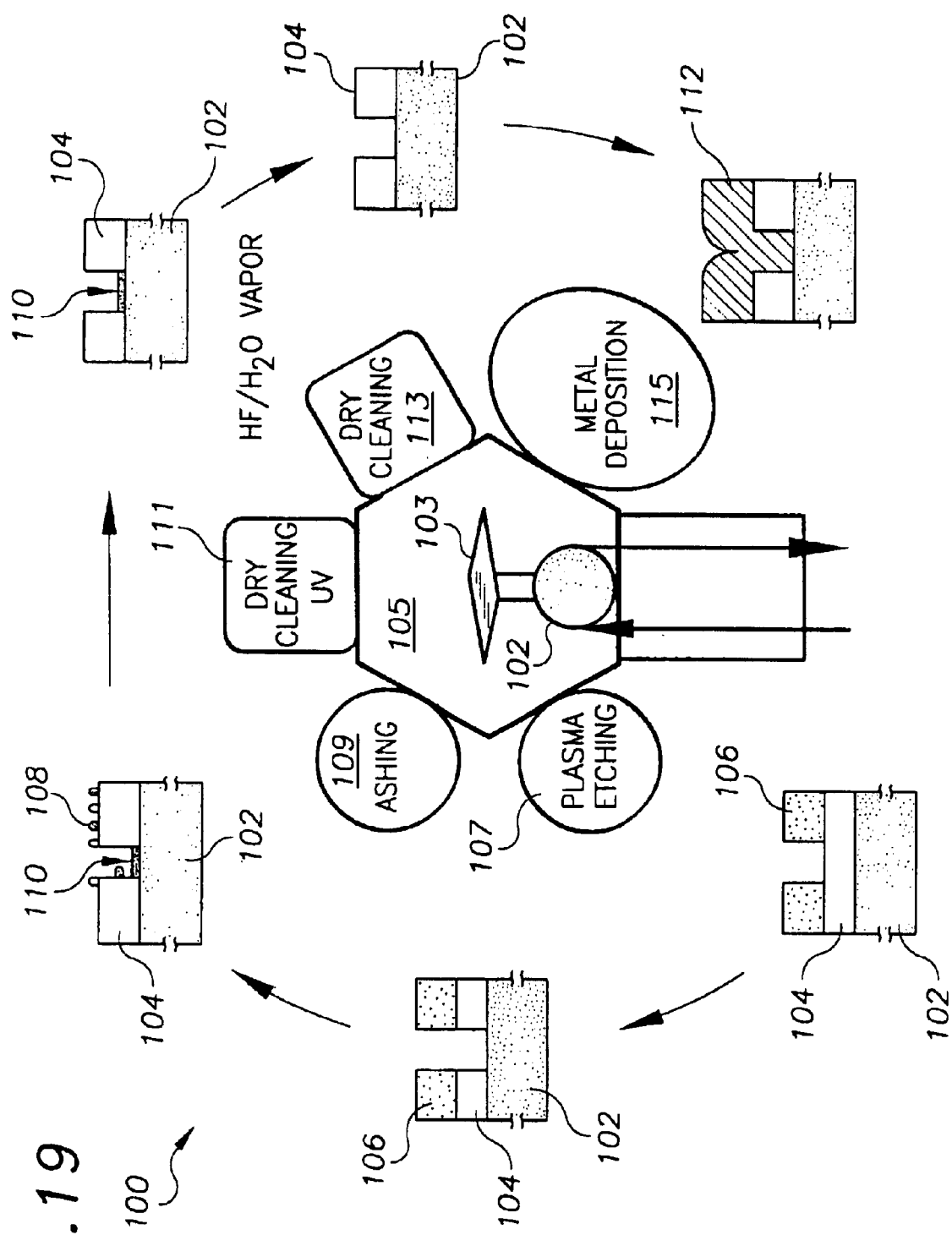

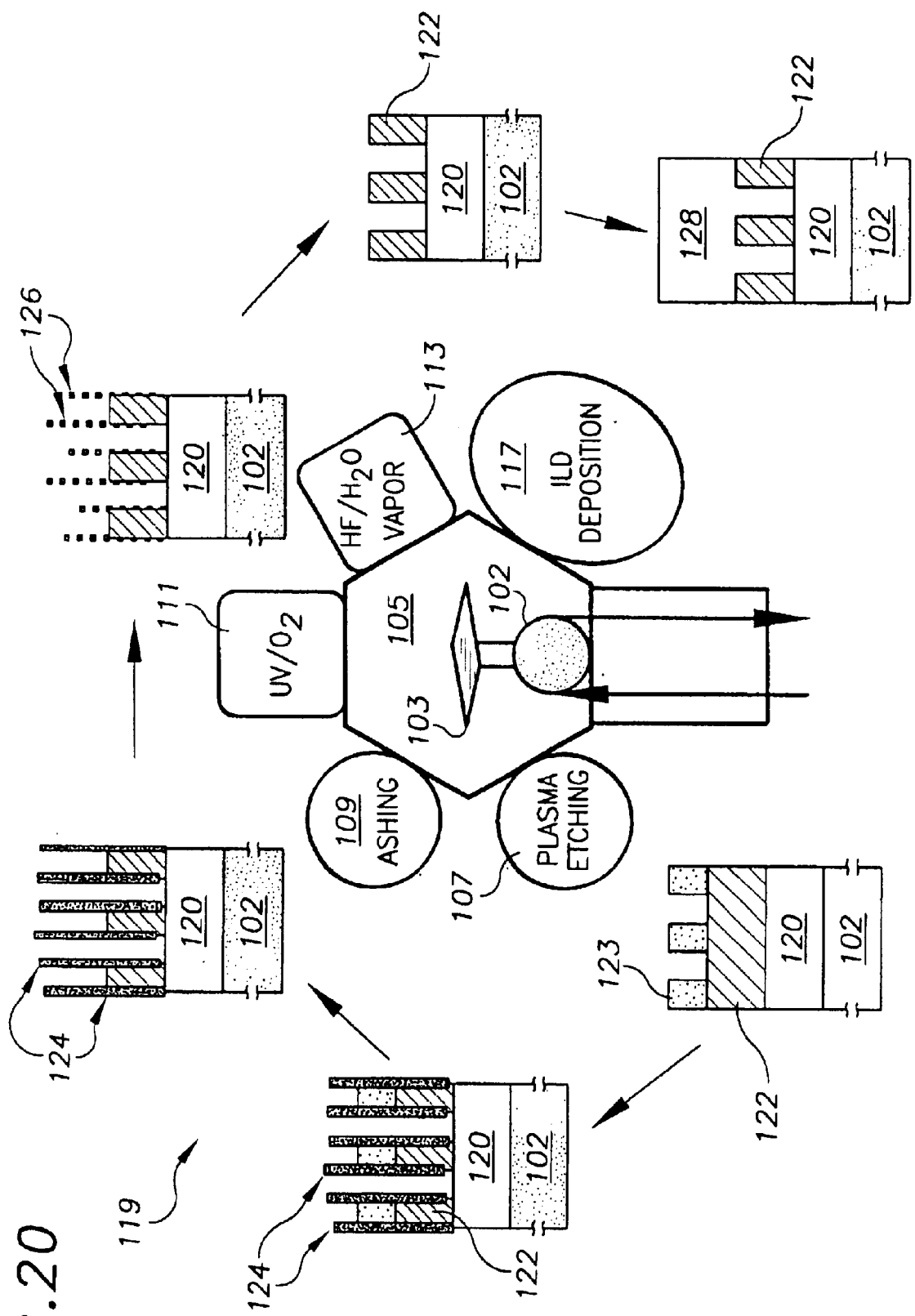

HF VAPOR PHASE WAFER CLEANING AND OXIDE ETCHING

This application claims the benefit of U.S. Provisional Application No. 60/118,937, filed Feb. 5, 1999, the entirety of which is incorporated by reference.

BACKGROUND OF THE INVENTION

This invention relates to processes for cleaning silicon substrates such as silicon wafers and for etching oxide layers on such wafers, and more particularly relates to wafer cleaning and oxide etching techniques employing hydrofluoric acid.

The effectiveness of cleaning processes for removing contamination from silicon wafers employed for microfabrication is growing ever more important as the critical size of microfabricated electronic devices shrink. Wafer contamination is generally introduced from wafer production and packaging, from exposure to the ambient, and from human exposure during processing, and can consist of particles, organic residue, adsorbed metal ions, and other contaminants. The vital role of wafer cleaning in microfabrication processing is evidenced by the fact that about one-third of the total number of steps in a given microfabrication process are cleaning steps.

To maximize microfabrication production yield, cleaning processes are relied on to remove wafer contamination without damaging or consuming the wafer and without introducing further contamination to the wafer. For silicon wafers, such cleaning typically includes removal of the native silicon dioxide layer, referred to here as a native oxide layer, for brevity, that is generally present on the wafer. Metal and other contamination can be trapped in this native oxide layer and would critically contaminate high-temperature processing equipment. Removal of the native oxide layer is therefore generally always carried out as an integral wafer cleaning process before any high-temperature processing a wafer.

Traditionally, silicon wafers are cleaned by way of aqueous phase cleaning processes that typically employ, e.g., acids, bases, and mixtures of various chemicals. Historically, such an aqueous phase process has been effective at removing contaminants and removing the native oxide layer. Now, however, as microelectronic features shrink to the submicron regime, as the aspect ratio of wafer topology greatly increases, and as the number of microelectronic metal interconnect layers is increased, traditional aqueous cleaning processes are less effective or completely ineffective. Thorough drying of rinse solutions from around and in small or high aspect ratio features can be difficult and can result in trapping of contamination at those features. Furthermore, new combinations of microelectronic materials and new exotic microelectronic materials can be adversely affected by aqueous cleaning chemicals that historically were considered benign to more conventional materials.

Aside from structure and materials considerations, it is found that microfabrication process facilities are under increasing pressure to reduce the volume of waste chemicals they generate. Wafer cleaning processes contribute substantially to this waste volume. As environmental regulations are increased, the pressure to reduce or eliminate aqueous wafer cleaning waste will also increase.

In response to many of these issues, the use of hydrofluoric acid (HF) vapor for cleaning silicon wafers, including etching of native oxide, and etching of thicker silicon dioxide layers, has been extensively studied. Typically, HF vapor wafer cleaning and etching is carried out in an in situ environment and employs vapor phase HF and, e.g., vapor or liquid water, an alcohol, and other optional components such as carrier gases. HF vapor etching is found to selectively etch oxide over silicon and to remove at least partially wafer contaminants.

HF vapor cleaning and etching has not been fully adopted for cleaning and etching steps in microelectronic fabrication processing, however, due to unwanted contamination that can be introduced by a vapor process itself, and due to a lack of clear understanding of the mechanisms and operational regimes of vapor-based wafer cleaning and etching, with a resulting inability to precisely control the processes. For example, it has been found that under some process conditions, liquid phase condensation of vapor phase reactants on a wafer can occur during a cleaning or etch process, and that high concentrations of reaction products in this condensed phase can result. If such reaction products do not desorb into the vapor phase when the process is stopped, they can produce particulate residue on the wafer. This residue contamination of the wafer is often characterized by diffuse light scattering, referred to as "haze" on the wafer surface. Typically, a post-vapor clean aqueous rinse step is required to remove any such residue contamination. This rinsing both consumes water and produces aqueous waste volume that the vapor process was motivated to do away with, and eliminates the ability to carry out an "all-dry" in situ process that is desirable for multi-process integration. But more fundamentally, the introduction of additional contaminants by a vapor process intended for contaminant removal renders the vapor process inefficient and ineffectual.

It has also been found that under some process conditions, multilayer adsorption, rather than condensation, of vapor phase reactants can occur on a wafer during a cleaning or etch process, and that localized thick multilayer reaction product regions can result. Such a condition is particularly apt to occur, for multilayer process conditions, during etching of a relatively thicker silicon dioxide layer. The reactant multilayer regions can accelerate the local etch rate and produce a localized piling up of reaction products, leading to pitting of the oxide layer being etched. Like the residue particulate formation discussed above, this oxide pitting is commonly characterized as "haze" on the etched layer surface. The lack of etch control of which this pitting is a symptom that is generally considered to disqualify the vapor etch process for microfabrication steps requiring high-precision.

Beyond the particular concerns of lack of process uniformity control and unwanted process contamination described above, it has historically been considered extremely difficult to guarantee HF vapor process repeatability or predictability with respect to starting wafer conditions such as contamination conditions. These various concerns, taken together, are generally considered to outweigh the potential benefits that HF vapor cleaning and etching might bring to microfabrication process efficacy, precision, economics, and environmental regulatory compliance.

SUMMARY OF THE INVENTION

The invention provides HF vapor process conditions that can be precisely controlled with a high degree of reproducibility for a wide range of starting wafer conditions. These HF vapor processes of the invention can be employed in accordance with the invention for etching oxide on a semiconductor substrate, for cleaning a contaminant on a semiconductor substrate, for removing etch residue from a metal structure on a semiconductor substrate, and for cleaning a metal contact region of a semiconductor substrate, among other applications.

In the HF vapor process method of the invention, a semiconductor substrate having oxide, a contaminant, metal etch residue, or a contact region to be processed is exposed to hydrofluoric acid vapor and water vapor in a process chamber held at temperature and pressure conditions that are controlled to form on the substrate no more than a sub-monolayer of etch reactants and products produced by the vapor as the substrate is processed by the vapor.

The sub-monolayer HF vapor process regime is defined in accordance with the invention to proceed under conditions wherein no more than about 95% monolayer coverage of the substrate surface occurs. This sub-monolayer coverage results in highly uniform, reproducible, and predictable etch and cleaning rates, such that the process is particularly robust for manufacturing scenarios, where, e.g., the oxide to be processed consists of silicon dioxide and the substrate to be processed consists of a silicon wafer. In the sub-monolayer process regime of the invention, the preferable etch rate of oxide is no more than about 10 Å/min. Small-sized and large-aspect ratio features are particularly well-handled by HF vapor processes carried out in the sub-monolayer regime of the invention.

The invention provides a further process for etching oxide and cleaning a contaminant on a semiconductor substrate; here the oxide or contaminant is exposed to a stream of frozen particles and then exposed to hydrofluoric acid vapor and water vapor in a process chamber held at temperature and pressure conditions that are controlled to form on the substrate no more than a multilayer of etch reactants and products produced by the vapor as the oxide is etched or the contaminant removed by the vapor.

The process chamber conditions can be more strictly controlled to form on the substrate no more than a mono-layer of etch reactants and products, or further controlled to form on the substrate no more than a sub-monolayer of etch reactants and products. The frozen particles can be provided as, e.g., frozen $CO_2$ particles.

The invention also provides particularly well-controlled processes for etching oxide on a semiconductor substrate. In a first such process, a positive electrical charge is produced on the oxide. Then the oxide on the substrate is exposed to hydrofluoric acid vapor and water vapor, methanol vapor, or isopropyl alcohol vapor in a process chamber held at temperature and pressure conditions that are controlled to form on the substrate no more than a saturated monolayer of etch reactants and products produced by the vapor as the oxide is etched by the vapor. The process chamber conditions can be more strictly controlled to form on the substrate no more than a sub-monolayer of etch reactants and products.

The positive electrical oxide charge can be produced by exposure of the oxide to an electron beam, by exposure of the oxide to ultraviolet radiation through a metallic screen, and by exposure of the oxide to a plasma environment wherein the substrate is biased by a negative-polarity DC voltage.

This process can be adapted to alternatively produce a negative electrical charge on the oxide or to release electrical charge from the oxide. In these cases, the process chamber conditions are controlled to form on the substrate no more than a multilayer of etch reactants and products. The process chamber conditions can also be more strictly controlled to form on the substrate no more than a monolayer or a sub-monolayer of etch reactants and products.

The negative electrical charge can be produced by exposure of the oxide to a plasma environment wherein the substrate is biased by a RF voltage, or by exposure of the oxide to a plasma environment wherein the substrate is biased by a positive-polarity DC voltage. The electrical charge can be released by exposure of the oxide to a stream of frozen particles, with the substrate temperature not being controlled during the exposure.

These various processes of the invention enable all-dry semiconductor substrate cleaning, oxide etching, and etch residue removal, among other processes, all that conventionally require large volumes of aqueous chemicals that conventionally cannot be precisely controlled. All-dry vacuum cluster systems including chambers for the HF vapor processes of the invention, as provided by the invention, enable high efficiency, precision, and reproducibility for critical and frequent processes required of most microelectronic fabrication sequences. Other applications, features, and advantages of the invention will be apparent from the following description and associated drawings, and from the claims.

BRIEF DESCRIPTION OF THE DRAWINGS

FIG. 19 is a schematic of a vacuum cluster processing system provided by the invention for cleaning metal contacts on a semiconductor substrate as an integral step in an all-dry multi-step process of dielectric patterning and metal deposition; and FIG. 20 is a schematic of a vacuum cluster processing system provided by the invention for removing post-etch residue from patterned metal lines as an integral step in an all-dry multi-step process of metal layer patterning and interlayer dielectric deposition.

DETAILED DESCRIPTION OF THE INVENTION

Figure 1:
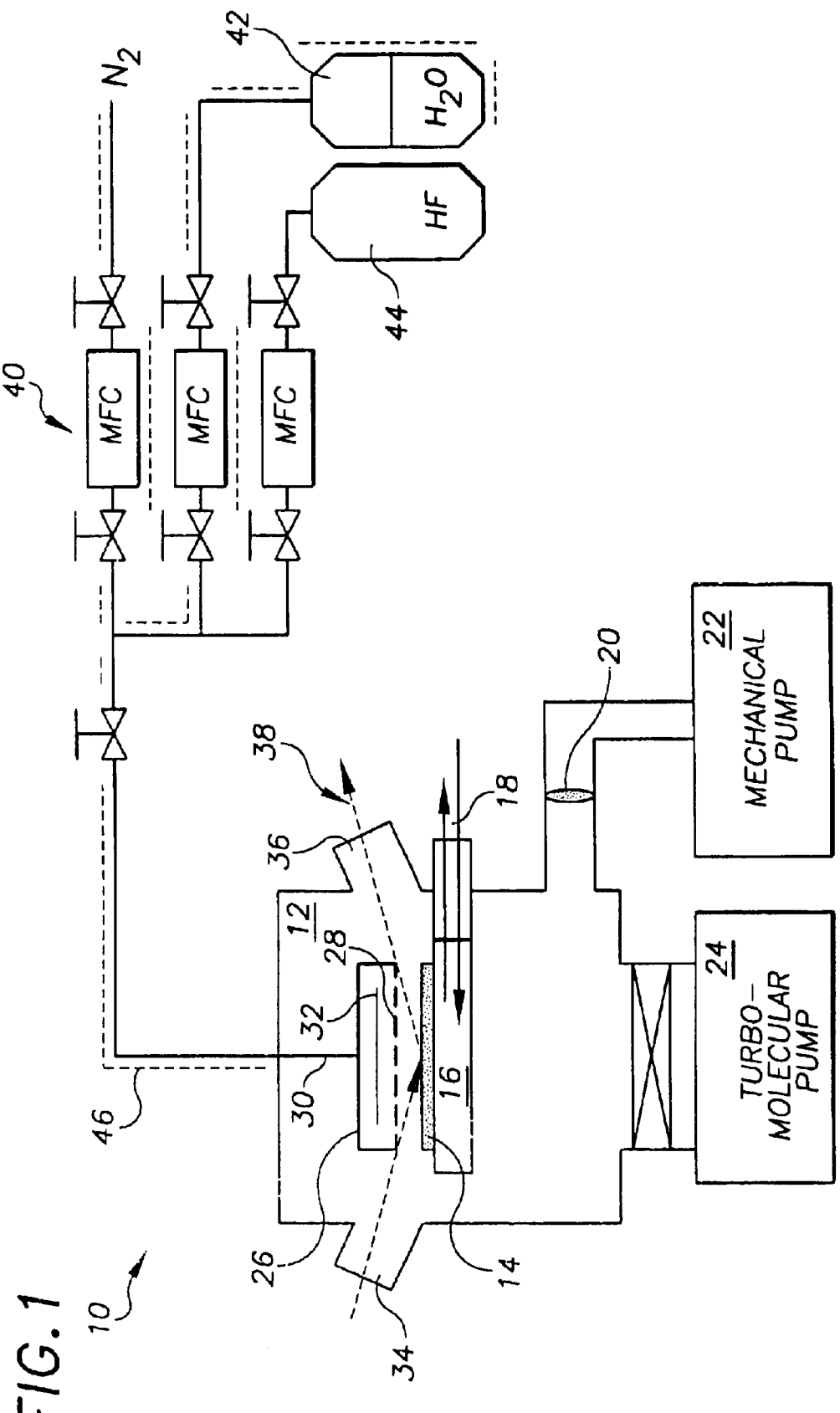
FIG. 1 is a schematic view of an example vapor processing system provided by the invention for carrying out the HF vapor processes of the invention.

Referring to FIG. 1, there is shown an example system 10 for carrying out the HF vapor processes provided by the invention. The processing system 10 includes a vacuum chamber 12, preferably of stainless steel. A material substrate to be processed, e.g., a wafer 14, is supported on a wafer platen 16, the temperature of which is preferably controlled, e.g., through a conventional water-based heating/cooling loop 18. A throttle valve 20 is provided for maintaining the pressure of the chamber employing, e.g., a mechanical pump 22 and turbo-molecular pump 24. A pressure sensor, e.g., a capacitance manometer, is provided to measure the chamber pressure under process conditions. Preferably, an ion gauge is provided to measure the chamber pressure during evacuation with the turbomolecular pump to assure good vacuum integrity of the chamber.

Optical ports 34, 36 of the chamber can be employed to conduct ellipsometric measurements 38 during a vapor process, e.g., for monitoring etch rate and film thickness in situ and in real time during a wafer cleaning or etching process. As can be recognized, a conventional ellipsometer, e.g., a model M44 ellipsometer manufactured by J. A. Woollam Co., Inc., of Nebraska can be employed for monitoring multiple wavelengths. The ellipsometer can be connected to, e.g., a computer for directing data to be analyzed by software, e.g., WVASE32, also provided by the J. A. Woollam Co., Inc.

A shower head 26 is provided for delivering process gases from a gas handling system into the chamber 12. Preferably, the showerhead is stainless steel, of a diameter of, e.g., about 2", 4", or other size corresponding to the diameter of the wafer or substrate to be processed, and includes a stainless steel screen 28 attached at its output to evenly distribute the gas flow delivery from a delivery tube 30 into the chamber. The screen can be provided with, as an example, an open area of about 9%, a 0.007" hole size, and a 0.022" hole pitch with 60° orientation. Additionally, a baffle 32 is preferably included in the shower head to block a direct stream of gas from the delivery tube 30 into the process chamber 12. This configuration enables a condition of relatively uniform mass transport of reactants via stagnation flow, allowing relatively uniform reactant supply across the wafer and reducing product build up. Preferably, the shower head is heated to prevent condensation of reactants on the head and corrosion of the head and to better exhaust reactants.

Process gases are introduced to the delivery tube 30 through mass flow controllers. The delivery tube is preferably stainless steel and of, e.g., about ¼" diameter. This tubing and shower head could also be lined with inert materials such as Teflon® to reduce contamination of the reactants and the wafer. Water vapor is supplied directly from a water tank 42 through a mass flow controller, preferably without a carrier gas. Preferably the water tank is heated to approximately 100° C. by an electrical resistance heater such as a heating tape. Anhydrous HF is delivered from a corresponding HF supply tank. Other gases to be optionally employed during a vapor process, e.g., $N_2$, are similarly delivered. Preferably, a heating tape 46 is provided for controlling the temperature of the gas delivery lines and mass flow controllers so as to prevent condensation of gases in the gas delivery system. This heating of the system also enables an increase in accuracy of gas metering and gas flow initiation and quenching, as well as inhibiting corrosion of the system.

In carrying out an HF vapor process provided by the invention, a wafer to be cleaned or including a film to be etched is loaded into the process chamber and the gas delivery lines are preferably heated by the heating tape to a temperature of between about 35° C. and about 120° C. to suppress condensation of reactants on the delivery lines. The temperatures of the gases to be delivered are preferably maintained at between about 30° C. and about 100° C. by controlling the temperature of the lines and showerhead. The wafer platen supporting the wafer is heated to preferably maintain the wafer at a constant temperature during the vapor process. The chamber walls are heated to prevent condensation of the HF, water, and products on them. Sufficient heating of the chamber walls is distinguished by rapid pump down of the system after the process is complete. For typical processes, a chamber temperature of approximately 60° C. is sufficient.

The wafer temperature is preferably maintained at between about 50° C. and about 200° C., e.g., by thermal conduction to the wafer holder. Preferably, the wafer platen is designed to provide a uniform temperature across the wafer and be in good thermal contact with the wafer; this can be achieved, e.g., by employing a anodized aluminum block having a smooth, flat surface and through which is circulated heating and cooling fluid. If desired, the wafer platen can be rotated during the vapor process to reduce the effects of mass transfer resistance of process reactants and products. The gap between the shower head and the wafer is set at between about 3 mm and about 50 mm, preferably about 12 mm, depending on the conditions of the wafer to be processed. An inert gas, e.g., nitrogen, is optionally flowed, at a flow rate of between about 200 sccm and about 1 liter, preferably about 500 sccm, until a target pressure of between about 10 T and about 500 T, preferably about 50 T, is achieved in the chamber. This enables stabilization of the operating chamber pressure while a pressure controller is on and can be particularly preferable where precise control of the vapor process is desired. Otherwise, the input of the nitrogen gas need not be carried out.

Water vapor is then introduced to the chamber at a flow rate of between about 5 sccm and about 100 sccm, preferably about 20 sccm. Vapor HF is then introduced at the precise time desired to initiate a wafer etch or cleaning process, at a target flow rate of between about 10 sccm and about 200 sccm, preferably about 50 sccm. Preferably, the HF flow rate is increased slowly from 0 to the target flow rate to prevent an overshoot of the flow rate. For the range of HF flow rates suggested, this flow rate increase can be completed typically in about 5 s to about 10 s.

The flow of water vapor and HF vapor is continued for a time selected to carry out a given cleaning or etch process, with the partial pressure of HF at between about 5 T and about 100 T and the partial pressure of the water at between about 2 T and about 50 T. Nitrogen flow can be continued or quenched at the start of the vapor process as-desired. During the vapor process, ellipsometric measurements can be taken to determine the etching rate, preferably after about 2 min to minimize any initial effect of the concentration of reactants near the sample at the start of the process, and continued throughout the process as-desired.

At a selected end time for the vapor process, the gas delivery is quenched and the chamber is pumped out by the mechanical pump. Once the base pressure of the mechanical pump is reached, the valve to that pump is closed and the gate valve to the turbo-molecular pump is opened, for pumping to continue with this second pump. When the pressure of the chamber is below some selected level, e.g., at about $5 \times 10^{-6}$ T or lower, the sample can be transferred from the chamber for further processing.

Control of HF vapor process parameters based on the procedures and parameter ranges given above, in accordance with the invention, enable HF vapor process operational regimes that maximize process control and repeatability and that mininmize or eliminate particulate contamination and pitting effects commonly associated with HF vapor processes. The inventors herein have discovered that in general a HF vapor process can proceed under any of four different operational regimes. An understanding of the distinct nature of vapor process characteristics in each of the regimes is provided by the invention and enables precise control of a selected regime.

Figure 2A:
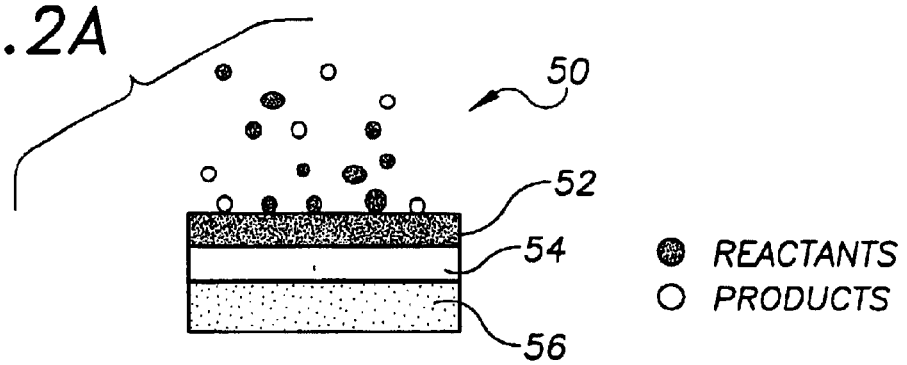
FIGS. 2A–2D are schematic views of an HF vapor process being carried out in accordance with the invention under conditions of a condensed layer regime, a multilayer adsorption regime, a saturated monolayer adsorption regime, and a sub-monolayer adsorption regime, respectively.

FIGS. 2A–2D schematically depict four general HF vapor process operational regimes identified by the inventors. The mechanisms by which the four regimes are formed and etch oxide on a silicon wafer depend specifically on the partial pressures of HF and water. The first regime, depicted in FIG. 2A, is one in which vapor-phase reactants 50 and other gases, e.g., HF, $H_2O$, and nitrogen, condense to form a condensed, liquid-phase layer 52 on an oxide layer 54 to be etched on a silicon wafer 56. The oxide layer 54 may be a native oxide layer or a thicker oxide layer that was deposited or grown on the wafer. Such a condensed layer forms when, e.g., for a given water vapor pressure, the selected partial pressure of HF, water, and product are sufficiently high that liquid can exist in contact with the vapor. The etch process in this regime proceeds in a manner that is substantially that of conventional liquid-phase HF etching. Etch product residue and particulate contamination can often occur in this etch regime. The thickness of the condensed layer varies as a function of process time and position across the wafer.

Figure 2B:
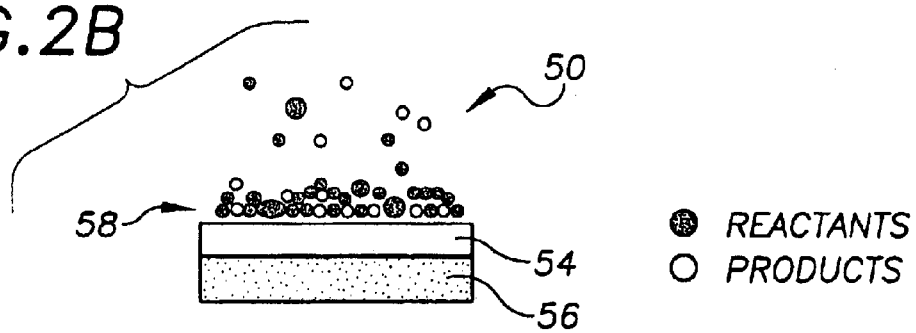

FIG. 2B depicts a second operational regime, here in which the process conditons are selected such that the vapor-phase reactants 50 form a multilayer 58 on an oxide layer 54 to be etched on a silicon wafer 56. The multilayer is produced by the adsorption of the reactant species in a manner that does not form a liquid, and is due primarily to strong bonding between a first layer and overlying layers. Typically only about 2–3 layers can form before a condensed, liquid-phase layer results. The multilayer regime possesses two sub categories: thin and thick. The thick multilayer is formed by increased product buildup by higher etching rates or lower product removal. For given concentrations of HF and water, a thin or thick multilayer can exist, with the thick multilayer exhibiting a higher etching rate. A thick multilayer can also form locally, producing areas of higher etching rate (where the thick multilayer exists) and areas of lower etching rate (where the thin multilayer exists). The multilayer regime formation is highly dependent on reaction species and their concentrations, transport of the products away from the surface, temperature, etching rates, and substrate material.

Figure 2C:
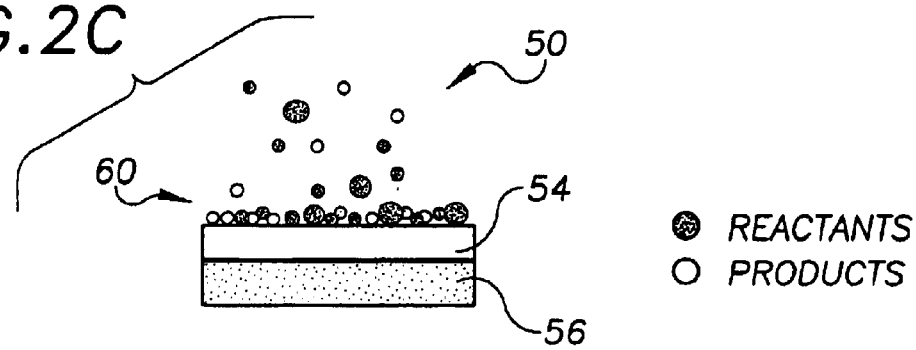

FIG. 2C depicts a third operational regime, in which the vapor process parameters result in a condition whereby vapor-phase reactants 50 form a monolayer 60 on the surface of an oxide layer 54 to be etched on a silicon wafer 56. The term "monolayer" as used here can be defined as a "saturated monolayer," in which the surface coverage of the oxide layer by the vapor-phase reactants approaches or is substantially at unity, but adsorption on top of this layer, i.e., formation of the multilayer, is not yet significant.

Figure 2D:
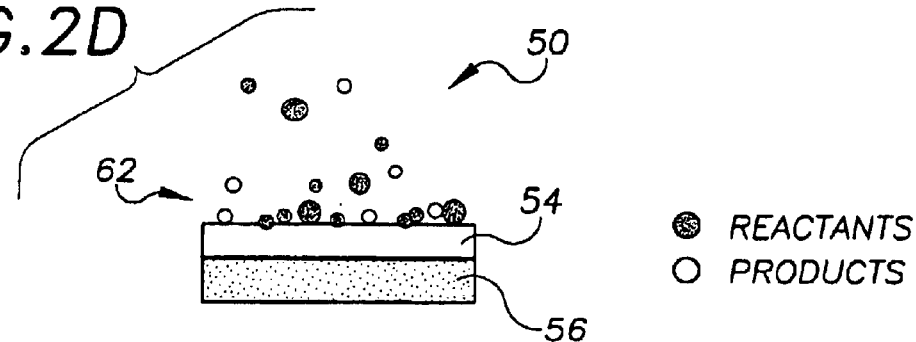

FIG. 2D depicts the final operational regime, in which the vapor process parameters result in a condition whereby vapor-phase reactants 50 form a sub-monolayer 62 on the surface of an oxide layer 54 to be etched on a silicon wafer 56. The sub-monolayer regime regime can be generally defmed as one in which no that about 95% of a monolayer exists.

The inventors herein have discovered that when an HF vapor process is controlled to proceed in the monolayer or sub-monolayer regimes, the oxide layer pitting, associated with processes in the multilayer regime, is reduced or eliminated. Similarly, the generation of etch product residue and particulate contamination associated with vapor processes in the condensed and multilayer regimes is reduced or eliminated in the monolayer and sub-monolayer regimes. Complete removal of native oxide can be accomplished in the monolayer and sub-monolayer regimes, and both are characterized by a substantially uniform etch rate. Wafers having large-aspect ratio features can be fully cleaned and overlying oxide layers etched without particle or residue contamination in the monolayer and submonolayer regimes because the effects of liquid surface tension are eliminated in these regimes. Surface tension and reduced product removal effects in recessed features can lead to locally-altered etching rates in recessed features. Each of these characteristics will be discussed in detail below.

EXAMPLE 1

The process parameters of a vapor-phase HF process for etching an oxide layer of about 540 nm in thickness, grown by thermal oxidation on a silicon wafer was carried out to identify the process conditions corresponding to the condensed regime and the uncondensed multilayer, monolayer, and sub-monolayer regimes described above. A silicon wafer was processed in the system of FIG. 1 and by the procedure described above. The wafer temperature was held at about 40° C., and the partial pressure of water vapor was held at about 5.4 T. The partial pressure of HF vapor was slowly increased over time. As the partial pressure of the HF vapor was increased, real time ellipsometric measurements were taken of the reactants forming on the oxide layer surface.

Figure 3A:
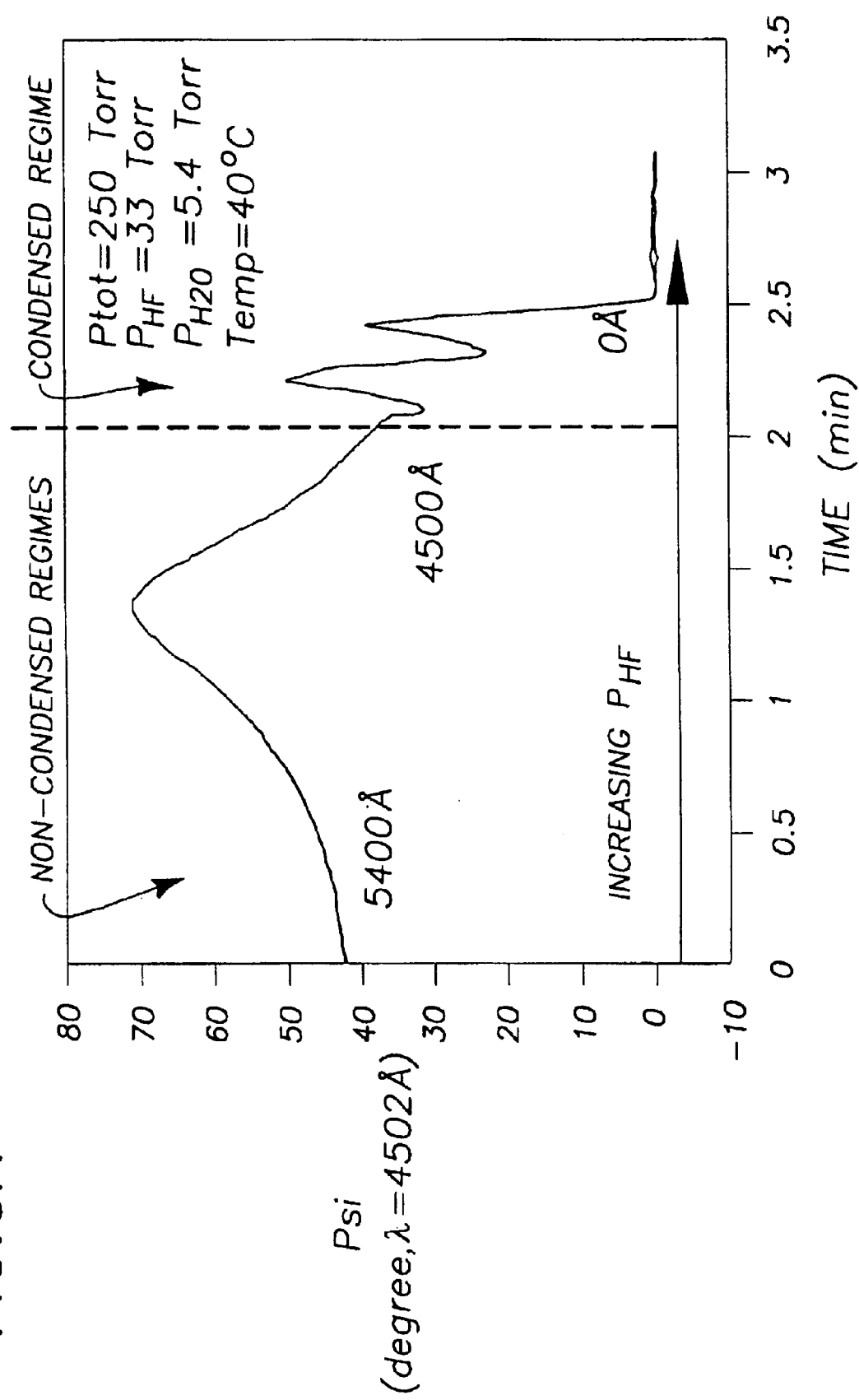
FIG. 3A is a plot of measured ellipsometric angle, Y (Psi), in degrees, at a wavelength of 4052 Å, as a function of time and increasing partial pressure of HF vapor, for the HF vapor process conditions indicated, highlighting the point at which the process makes a transition from a non-condensed operating regime to a condensed layer operating regime.
Figure 3B:
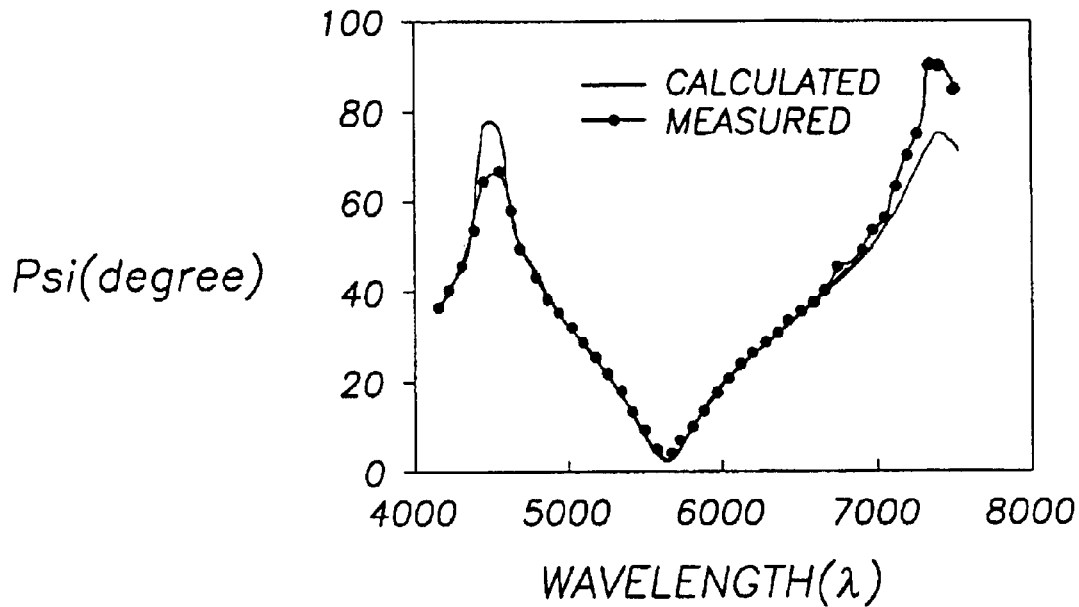
FIGS. 3B–3C are plots of measured and calculated ellipsometric angle, Psi, in degrees, as a function of wavelength, for a non-condensed operating regime and for the condensed layer operating regime, respectively.
Figure 3C:
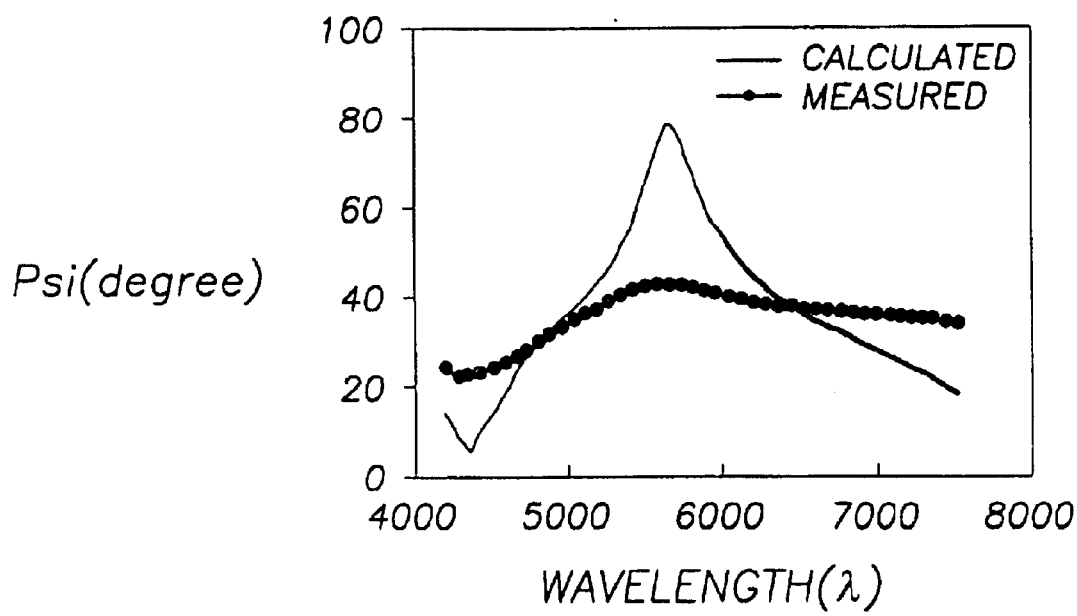

Referring to FIG. 3A there is shown a plot of the measured spectroscopic ellipsometric signal at a wavelength of about 4502 Å as the partial pressure of the HF vapor was increased. FIG. 3B is a plot of measured and calculated ellipsometric signals taken over the range of wavelengths shown, for the conditions to the left in FIG. 3A, where the HF vapor partial pressure was less than about 33 T. FIG. 3C is a plot of measured and calculated ellipsometric signals taken over the range of wavelengths shown, for the conditions to the right in FIG. 3A, where the HF vapor partial pressure was greater than about 33 T.

It was found that for the temperature and water vapor conditions selected, at an HF vapor partial pressure of about 33 T, a condensed layer of reactants started to form on the oxide layer. Before the occurrence of this condition, the ellipsometric measurements of FIG. 3A gradually increased and then decreased as the oxide film was etched as the HF vapor partial pressure was increased. Once a condensed layer began to form, the ellipsometric measurements were found to increase in frequency, indicating rapid etching as the HF vapor partial pressure was increased beyond the condensation point.

As shown in FIG. 3B, the calculated ellipsometric signal values and measured values across a range of wavelengths were found to be well fitted by a model for etching of an oxide layer over silicon wherein no condensed layer was formed. Conversely, as shown in FIG. 3C, the calculated ellipsometric signal values and measured values were found to not fit a model for etching of a simple oxide layer over silicon, because of the formation of a condensed layer over the oxide with varying thickness. It is understood that for the non-condensed regimes, vapor-phase molecules adsorbed on the oxide surface did not impact the correctness of the ellipsometric measurement, leading to its good agreement with calculated values. For the condensed regime, the non-uniformity of the condensed layer, as it was formed and grew, set up a condition of interference with the ellipsometric measurement, resulting in unpredictable signal values. Therefore, the ellipsometric measurements were shown to be a sensitive metric of whether a condensed film was present.

EXAMPLES 2–3

Figure 4A:
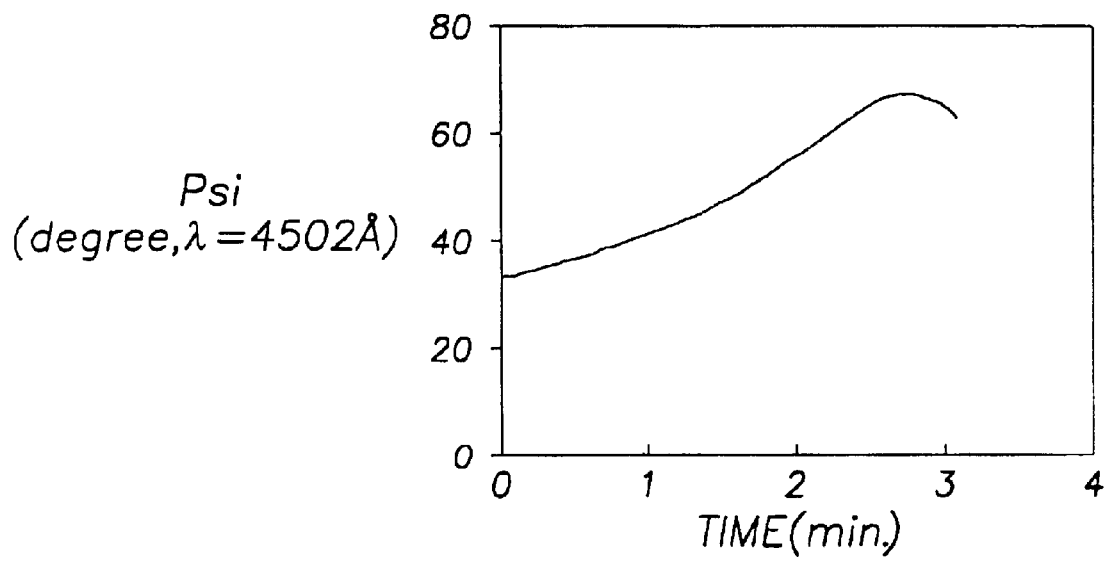
FIGS. 4A–4B are plots of measured ellipsometric angle, Psi, in degrees, at a wavelength of 4052 Å, as a function of time, taken during the HF vapor etching of a thermal oxide layer in a non-condensed regime and in the condensed regime, respectively.

A layer of oxide of about 5500 Å in thickness, grown by thermal oxidation on a silicon wafer was etched following the HF vapor etch procedures given above, with the conditions set such that the etch was carried out in a noncondensed regime. FIG. 4A is a plot of ellipsometric spectroscopic signal for a wavelength of 4502 Å taken during the etch process. As the thickness of the oxide layer decreased due to the etch, the signal increased in an expected manner. The etching process was stopped at 3 min after etching about 300 Å of the oxide.

Figure 4B:
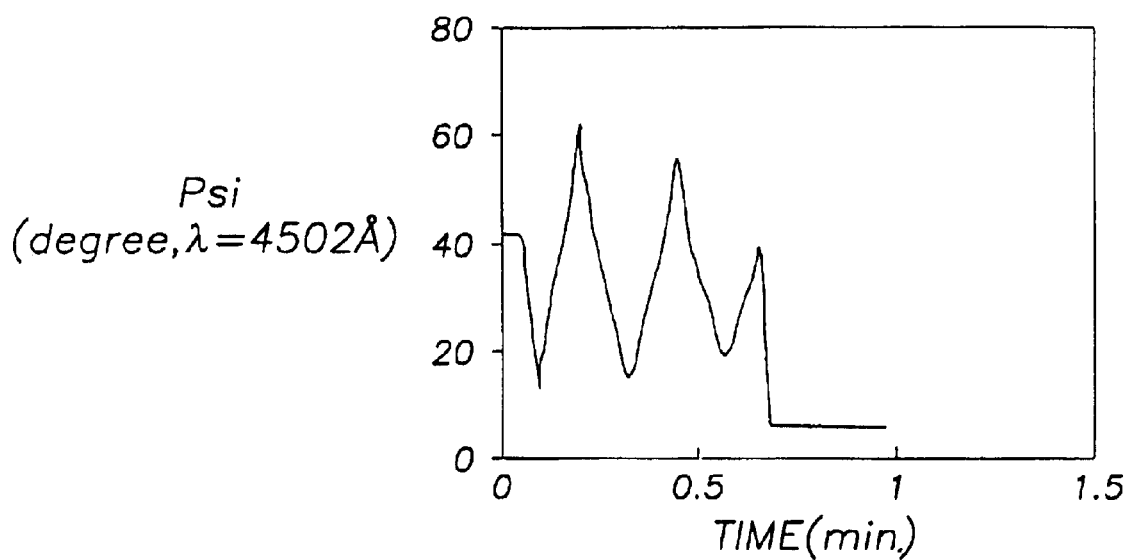

A layer of thermal oxide of about 5500 Å in thickness was also etched following the HF vapor etch procedures given above, here with the conditions set such that the etch was carried out in the condensed regime. FIG. 4B is a plot of ellipsometric spectroscopic signal for a wavelength of 4502 Å taken during the etch process. As the thickness of the oxide decreased and the condensed layer is formed, the measured signal displayed the characteristic interference due to the etching of the oxide layer; however, the varying thickness of the condensed layer complicates the thickness measurement. The complete etch of the layer was completed in about 0.65 min, as indicated in the plot.

Examples 1–3 demonstrate that one can identify the state of an HF vapor process as being in the condensed or one of the noncondensed regimes based on the degree of correspondence between calculated and measured ellipsometric signal values and the behavior of the signal as an etch proceeds. Condensed layer etching can be characterized by an ellipsometric signal that displays high rates of etching via the interference cycles and the time for completion and the inability to fit to a thin film model for multiple ellipsometric wavelengths because of nonuniformity in a condensed layer. The multilayer regime cannot be easily distinguished from the ellipsometric measurements, but can be distinguished by its characteristic reduction in etching rate with increasing temperature between the condensed and the monolayer regime.

EXAMPLES 4–8

The impact of temperature and pressure on oxide etch rate was measured for HF vapor processes carried out in the sub-monolayer, monolayer, and multilayer noncondensed regimes to further characterize the distinctions between the three regions. Referring to the Arrhenius plot of FIG. 5, vapor HF oxide etches were carried for a range of temperatures and for five different partial pressure conditions. Each of the wafers was subjected to a pre-etch step in which a positive charge was produced on the oxide layer. Details of this charging step and its impact on the etch characteristics are provided below.

In all cases, a layer of thermal oxide of a thickness of about 5500 Å was exposed to the etch conditions for about 6 min. The total gas flow rate for all of the etch processes was set at 500 sccm. For the cases where the HF vapor partial pressure was 20 T, 15 T, or 10 T and the water vapor partial pressure was 8 T, 6 T or 4 T, respectively, the total pressure was 125 T. For the case where the HF vapor partial pressure was 5 T and the water vapor partial pressure was 2 T, the total pressure was 62.5 T. For the case where the HF partial pressure was 2.5 T and the water vapor partial pressure was 1 T, the total pressure was 31.8 T. Ellipsometric measurements were taken during each etch process to determine the corresponding etch rate.

The plotted etch rate trends enable a clear recognition of the three noncondensed layer regimes. In the sub-monolayer regime, for a given temperature, as the reactant partial pressures are increased, the etch rate increases but the effect of increasing pressure diminishes as the monolayer conditions are approached. The etch rate thus asymptotically approaches a saturation point in the etching rate as the pressure is increased. This is consistent with an understanding that the etch rate in the sub-monolayer regime is impacted by the amount of adsorbed reactant molecules. Generally, for given partial pressures, as the temperature is increased, the sub-monolayer etch rate also increases.

Figure 5:
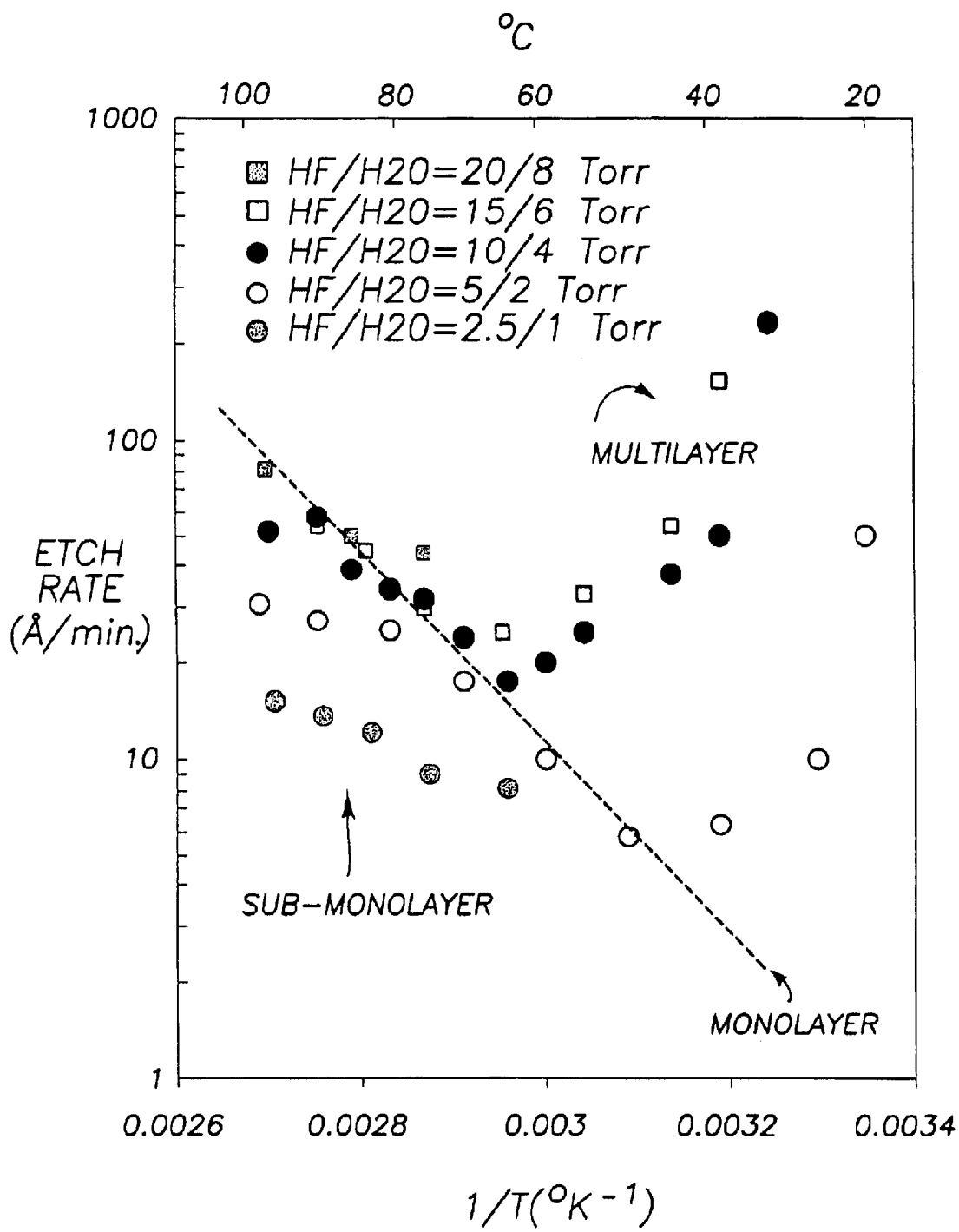
FIG. 5 is an Arrhenius plot of measured etch rate, in Å/min, as a function of temperature, for five different HF vapor etch conditions, which include HF vapor processes in the multilayer adsorption regime, the monolayer adsorption regime, and the sub-monolayer adsorption regime of the invention.

The saturated monolayer regime is distinguished by its positive apparent activation energy, with a positive Arrhenius response, reflected by the downward slope of the dotted line on the Arrhenius plot in FIG. 5 and the corresponding increasing etch rate with increasing temperature. This temperature dependence is stronger than that in the sub-monolayer regime, which does not follow a true Arrhenius response in temperature but demonstrates a positive response with temperature increase. The etch rate of the saturated monolayer regime is relatively independent of the partial pressures when their ratio is maintained constant; this is consistent with the distinction that the monolayer regime defines a condition wherein the oxide surface is substantially covered and changes in the partial pressure do not greatly affect the coverage.

The multilayer regime is distinguished from the monolayer regime by a negative Arrhenius response to temperature increase; as the temperature is increased, the etch rate decreases. In the multilayer regime for a given temperature, as the pressure is increased, the etch rate increases. From these observations, it is found that the monolayer regime can be identified by a weak dependence on pressure, with the multilayer regime distinguished by a strong dependence on pressure. The monolayer regime further is distinguished by a first increase in etch rate with increasing temperature at a temperature greater than that at which a negative etch rate-temperature dependence is demonstrated, which characterizes the multilayer regime. The sub-monolayer regime is then characterized by temperatures that are higher than the first temperature increase that indicates a shift from the multilayer to the monolayer regime. Furthermore, a positive Arrhenius temperature response is demonstrated in the sub-monolayer regime approaching the monolayer regime, but a negative Arrhenius response is demonstrated in the multi-layer regime approaching the monolayer regime. Finally, the etch rates of the sub-monolayer and monolayer regimes are lower than the etch rates of the multilayer regime at the same temperatures.

The proportionality between HF and water vapor partial pressure and etch rate in the monolayer and sub-monolayer regimes for a reasonable range of process conditions enables the modeling of the oxide etch rate in the monolayer and sub-monolayer regimes based on Langmuir-Hinshelwood kinetics, where the etch rate is assumed to be roughly proportional to the fraction of HF and water vapor that is adsorbed on an oxide surface. Using this model, and based on the experimental data given above, the oxide etch rate, E. R., in the sub-monolayer and monolayer regimes can be given as:

$$E.R. = \frac{1.059 \times 10^{12} e^{-15500/RT} \times 1.79 \times 10^{-9} e^{13000/RT} P_{HF} \times 9.107 \times 10^{-8} e^{10500/RT} P_{H_2O}}{(1 + 1.79 \times 10^{-9} e^{13000/RT} P_{HF} + 9.107 \times 10^{-8} e^{10500/RT} P_{H_2O})^2} \quad (1)$$

where E.R. and the pre-exponential factor are expressed in Å/min; where $P_{H2O}$ is the partial pressure of the water vapor and $P_{HF}$ is the partial pressure of the HF vapor, both in Torr; R is the ideal gas constant, T is temperature, and where all activation energies are expressed as Kcal/mol.

Figure 6:
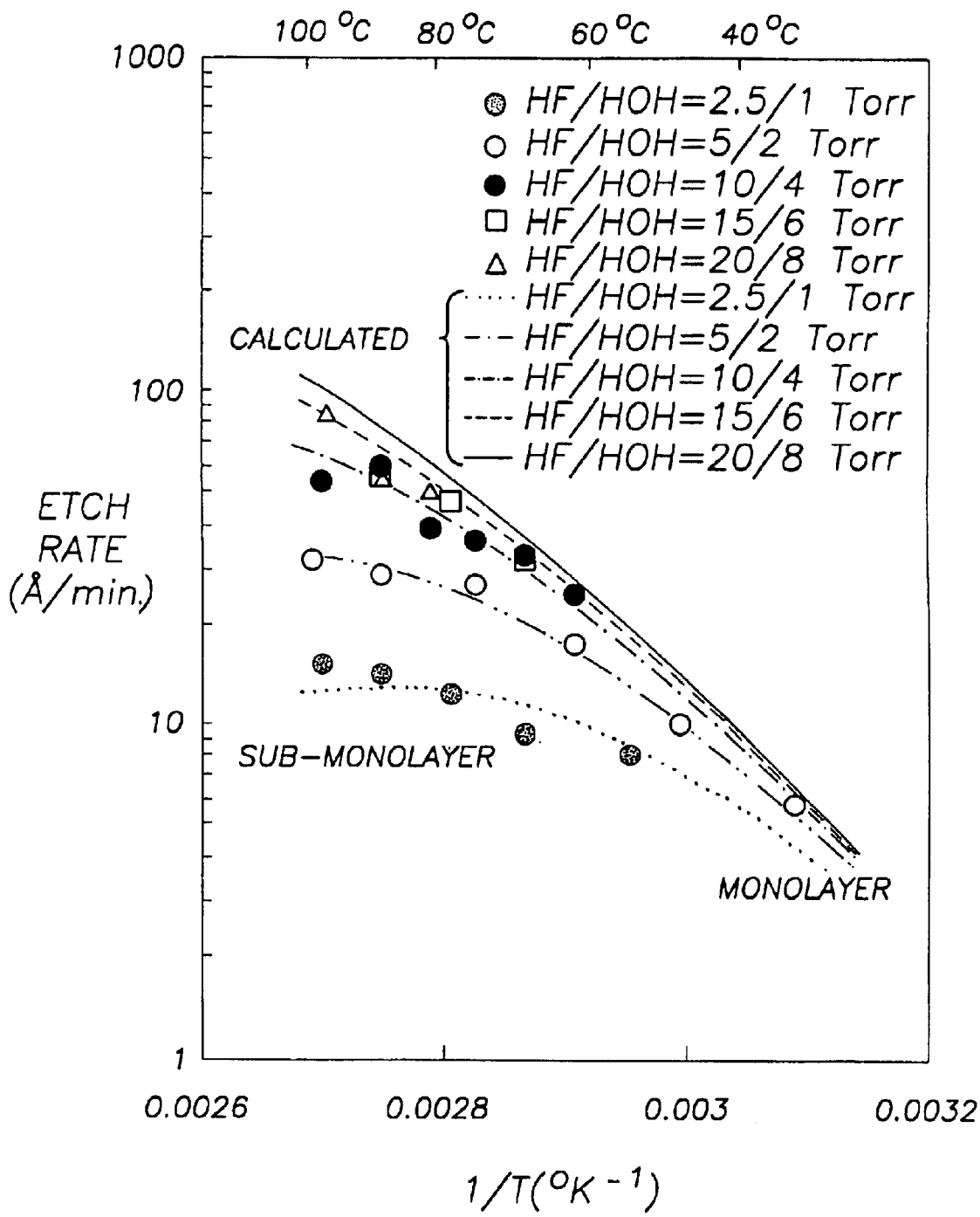
FIG. 6 is an Arrhenius plot including only those points from the plot of FIG. 5 corresponding to the monolayer and sub-monolayer adsorption regimes, and further including calculated values for the points.

The Arrhenius plot of FIG. 6 replots the data from FIG. 5 for the monolayer and sub-monolayer regimes, along with the-etch rate values calculated for each condition based on expression (1) given above. The good fit between the calculated and measured values validates the assumption discussed above with regard to the dependence of the sub-monolayer regime on fraction of adsorbed reactants. The oxide etch rate of the sub-monolayer and monolayer regimes is found from the plot of FIG. 6 to be between about 10 Å/min and about 100 Å/min.

Because the etch rate is approximately proportional to the coverage of the surface in the sub-monolayer and monolayer regimes for a fixed ratio of partial pressures of the HF and water, the etch rate can be used to determine the approximate coverage of the surface at a fixed temperature. For example, given an etch rate of 100 Å for the monolayer coverage, a measured etch rate of 95% of the value would reflect a 95% coverage of the surface by the reactant. The invention defines the sub-monolayer regime as including up to about 95% surface coverage. This etch rate-coverage correspondence is thus found to effectively enable distinctions between the sub-monolayer and monolayer regimes.

EXAMPLES 9–10

Figure 7A:
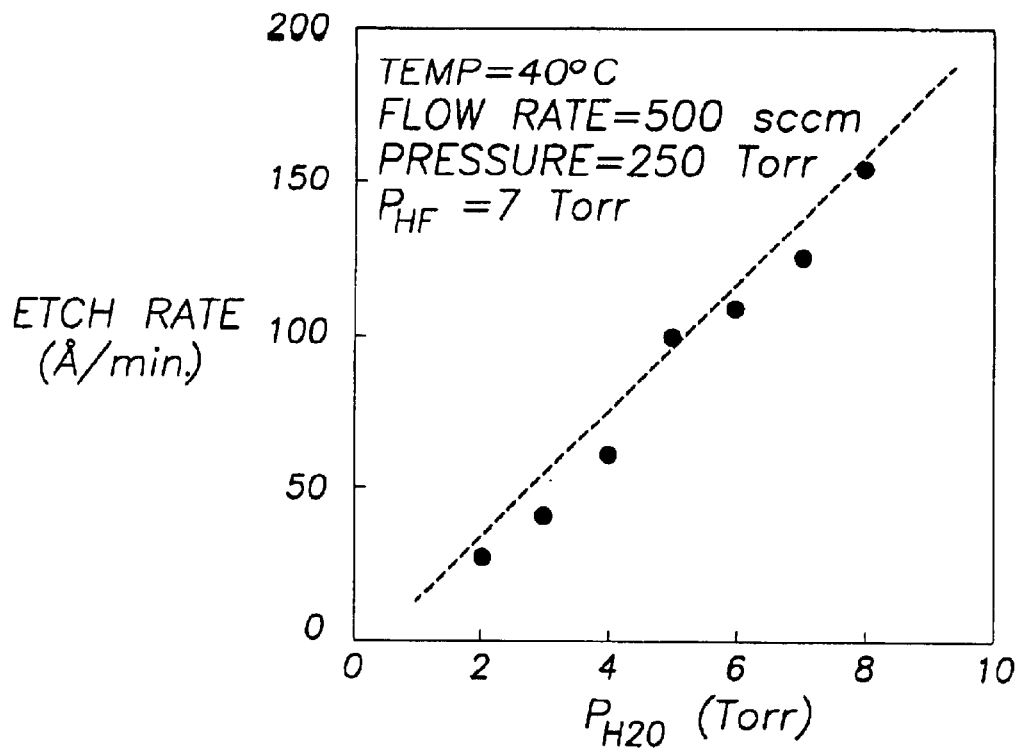
FIG. 7A is a plot of measured etch rate, in Å/min, as a function of the partial pressure of water vapor, in Torr, for the HF vapor multilayer process conditions of the invention indicated.

The oxide etch characteristics of the multilayer regime were further investigated to provide identifying distinctions of this regime. There is shown in FIG. 7A a plot of oxide etch rate as a function of the partial pressure of water vapor, for a water temperature of 40° C., a total flow rate of 500 sccm, a total pressure of 205 T, and an HF vapor pressure of 7 T. These measurements were made on thermal oxide samples of about 5500 Å in thickness that were etched for several minutes while the thickness were measured using ellipsometry. The change in thickness per minute (etch rates) were computed from this data. From the plot it is seen that the multilayer regime is characterized by an oxide etch rate that is substantially linearly proportional to water vapor partial pressure.

Figure 7B:
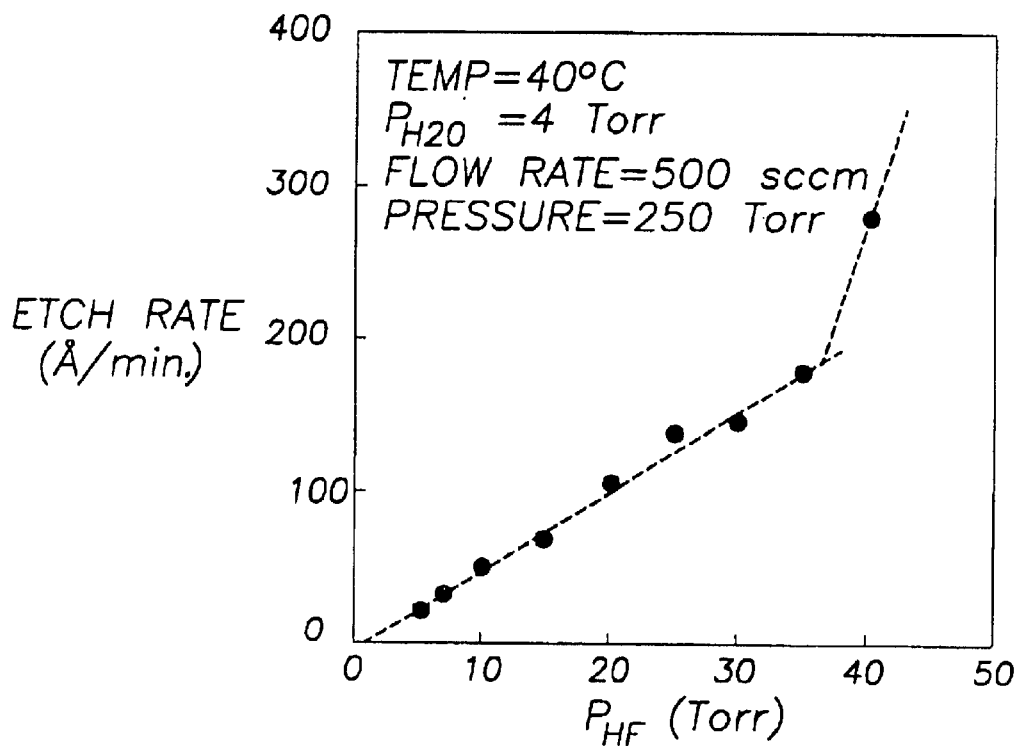
FIG. 7B is a plot of measured etch rate, in Å/min, as a function of the partial pressure of HF vapor, in Torr, for the HF vapor multilayer process conditions of the invention indicated.

Similarly, referring to the plot of FIG. 7B, it is found that for a partial pressure of water vapor of 4 T, a temperature of 40° C., a total flow rate of 500 sccm, and a pressure of 250 T, the multilayer regime is characterized by a generally proportional response to increases in the partial pressure of HF vapor. It is noted, however, that above an HF vapor partial pressure of about 35 T this linearity fails. Such is understood to be caused by a transition from the thin multilayer regime to a thick multilayer regime. At higher water partial pressures than shown in FIG. 7A, a similar transition is expected. At even higher water and/or HF partial pressure than shown in FIG. 7B, the condensed layer regime would exist. The multilayer regime including both the thin and thick regions at a given temperature lies between monolayer and condensed regimes having higher partial pressures of HF and/or the bordering monolayer regime, but lower partial pressures than the bordering condensed regime.

Having clearly distinguished the characteristics of the condensed, multilayer, monolayer, and sub-monolayer HF vapor process regimes, the inventors herein have discovered that many of unwanted effects commonly associated with HF vapor processing can be eliminated if the process is carried out in either the monolayer or sub-monolayer regime. For many applications, the sub-monolayer regime is preferred.

Considering first the common occurrence of oxide layer pitting and haze during HF vapor etching, as discussed earlier, such pitting is typically associated with conditions in the multilayer regime and is the result of localized formation of thicker multilayer regions that accelerates the local etch rate.

EXAMPLE 11

A layer of oxide of 5500 Å in thickness, and thermally grown, was formed on each of two silicon wafers. Both of the oxide layers were subjected to an electrical charging step, described in more detail below. One of the oxide layers was etched in an HF vapor etch process under multilayer conditions of 40° C., 125 T total pressure, 500 sccm total gas flow rate, 10 T HF vapor partial pressure, and 4 T water vapor partial pressure. The other oxide layer was etched in an HF vapor etch process under monolayer conditions of 90° C., 125 T total pressure, 500 sccm total gas flow rate, 10 T HF vapor partial pressure, and 4 T water vapor partial pressure. As shown in FIG. 6, the etching rate predicted by the Langmuir-Hinshelwood model for this condition lies near the border of the monolayer and sub-monolayer regimes. For both the monolayer and sub-monolayer regimes, the samples were observed to be specular, i.e. not exhibiting hazing which is caused by pitting or particulate contamination of the surfaces.

Each of the etch processes was suspended after 200 Å of oxide had been etched, as determined by ellipsometric measurements. Atomic force microscopy (AFM) was then carried out to analyze the surface morphology of the partially etched oxide layers.

Figure 8A:
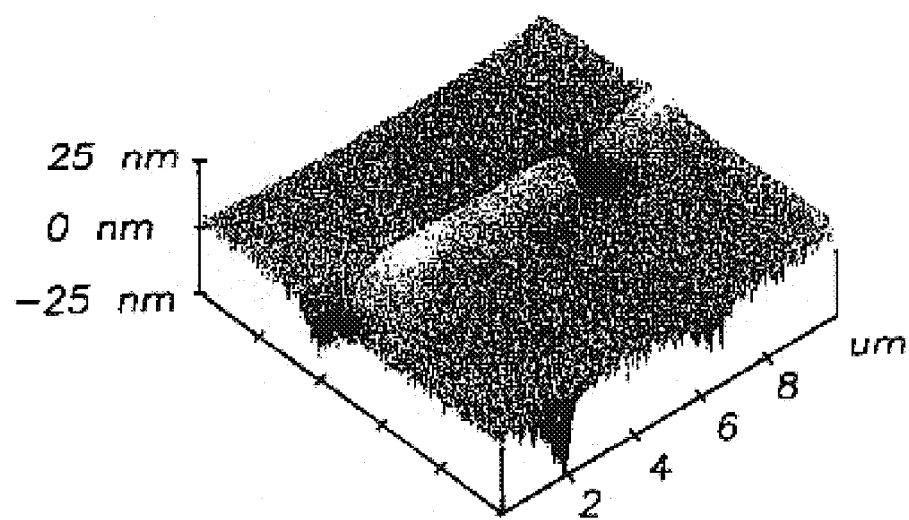
FIGS. 8A and 8B are plots, produced by atomic force microscopy, of measured layer topology height, in nanometers, as a function of layer extent, in microns, for an oxide layer that has been partially etched by an HF vapor process in the multilayer adsorption regime, and for an oxide layer that has been partially etched by an HF vapor process in the monolayer adsorption regime of the invention, respectively.
Figure 8B:
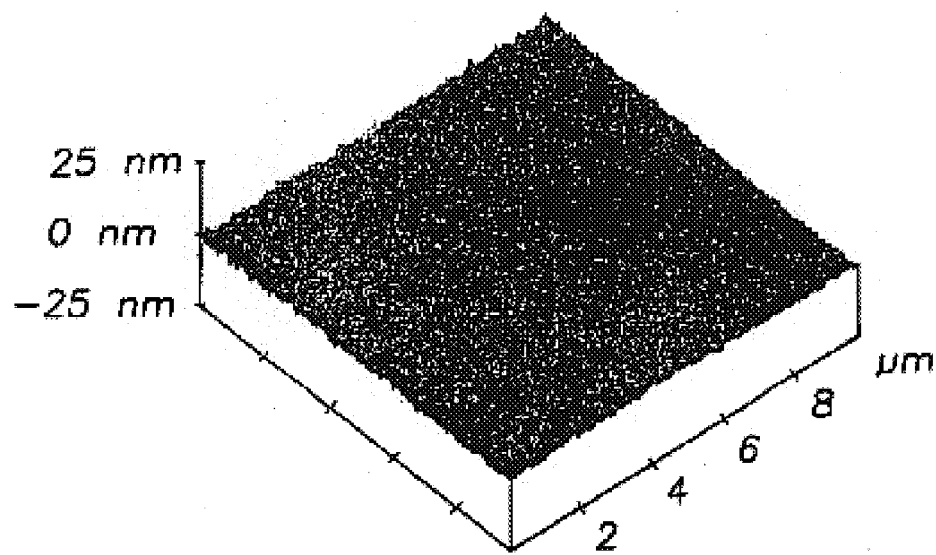
Figure 9B:
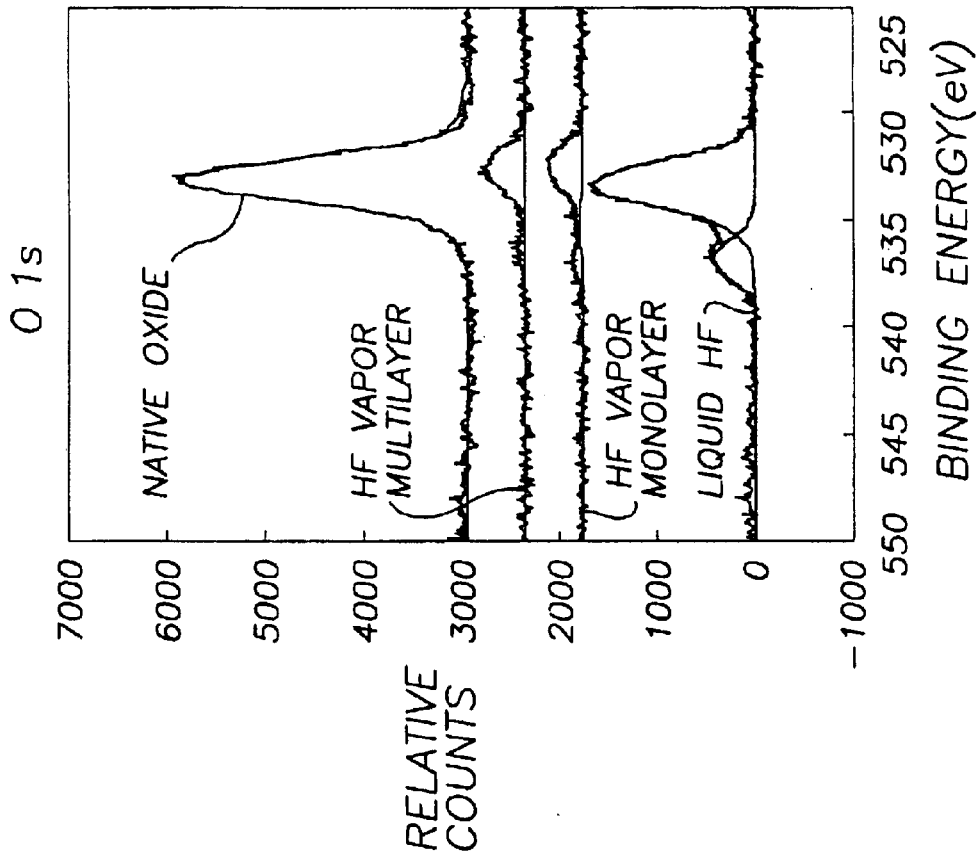
FIGS. 9A–9D are XPS plots of measured relative counts as a function of binding energy, in eV, centered on the energy corresponding to the Si 2p, O 1s, 1C 1s, and F is bonds, respectively, for a native oxide layer on a silicon wafer, for a silicon wafer the native oxide layer of which was etched by HF vapor in the multilayer regime, for a silicon wafer the native oxide layer of which was etched by HF vapor in the monolayer regime of the invention, and for a silicon wafer the native oxide layer of which was etched by liquid HF.
Figure 9A:
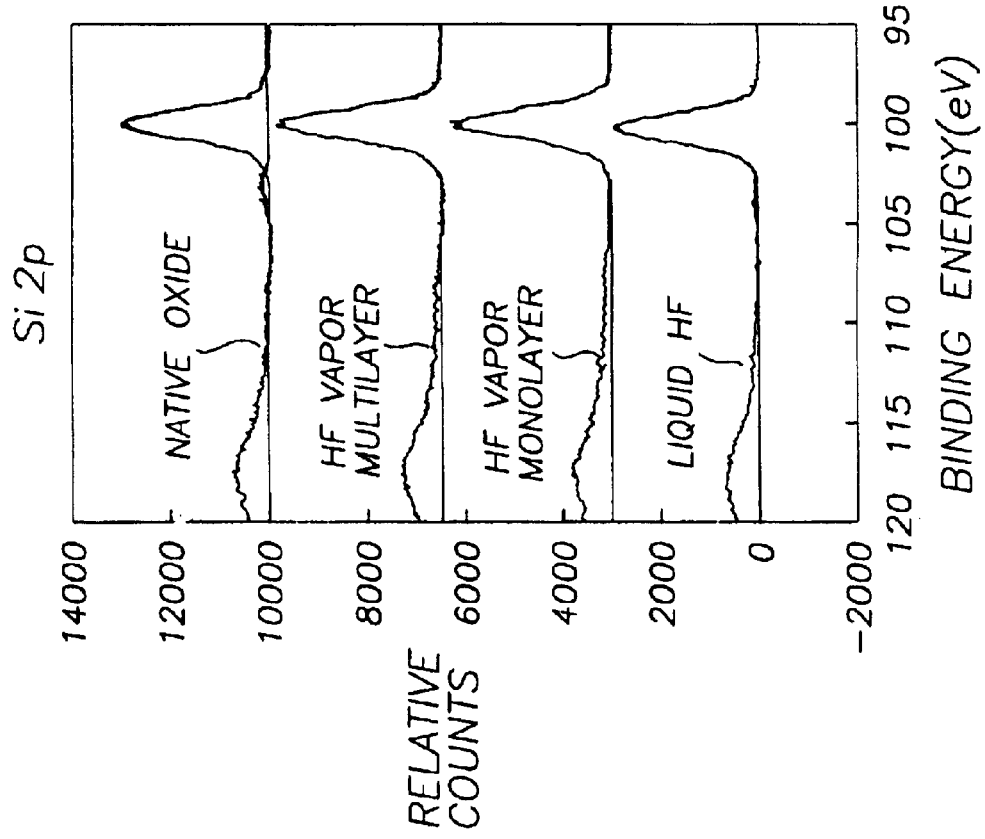
Figure 9D:
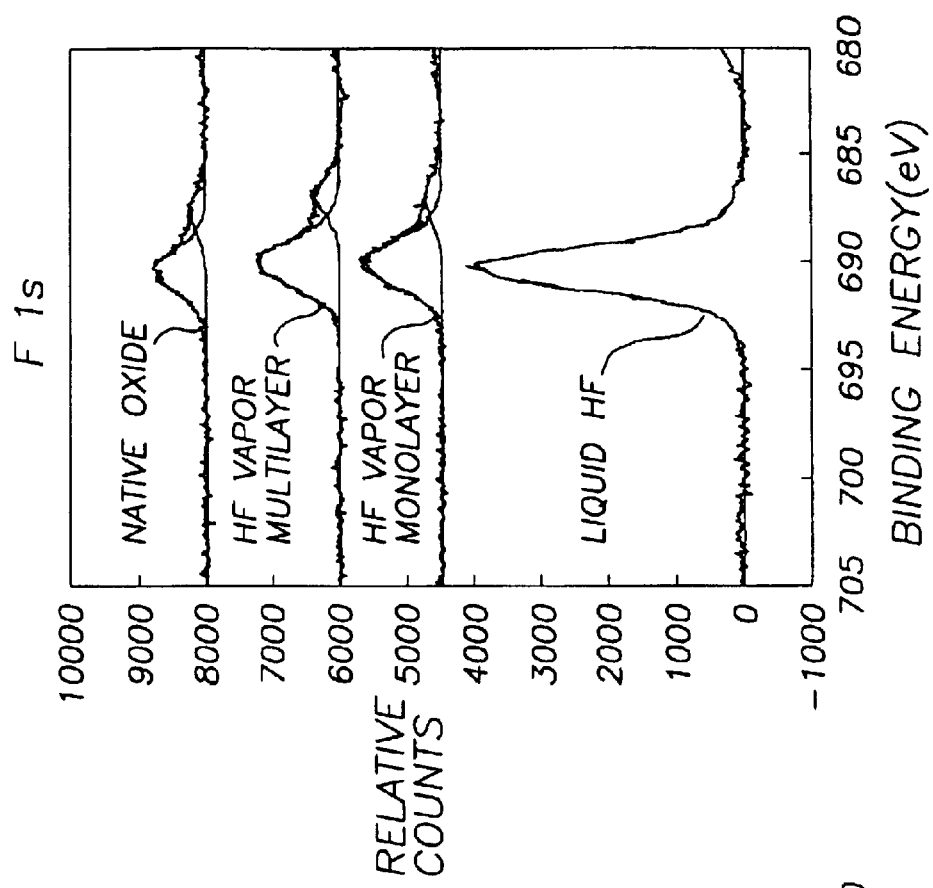
Figure 9C:
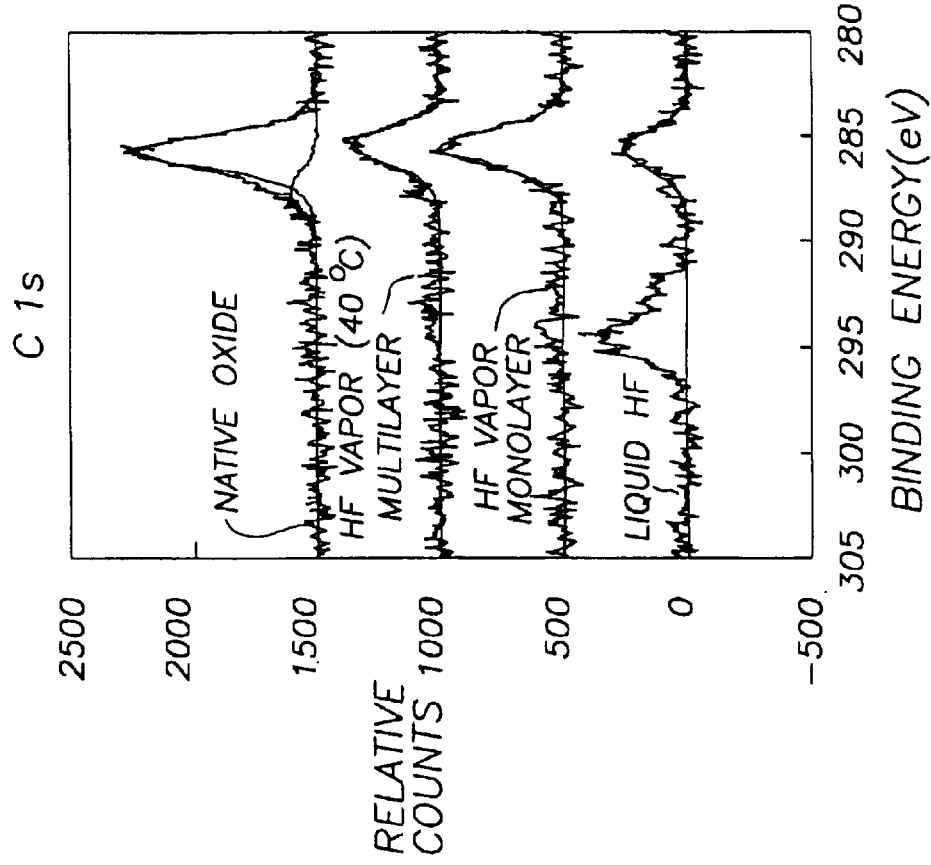

FIG. 8A is the AFM profile produced for the sample etched in the multilayer regime and which exhibited hazing, and FIG. 8b is the AFM profile produced for the sample etched under the conditions indicated above and which was specular in appearance. Note that the multilayer-etched sample exhibits substantial pitting, producing surface haze. The elevated feature to the sides of the pitting is an AFM artifact. The size of each pit is about 10,000 Å in diameter and between about 100 Å–200 Å in depth, confirming that each pit is not a deep trench but a recessed area that would be produced by a locally high etch rate.

The profile of the monolayer-etched sample does not exhibit any pitting; uniform etching across the entire wafer is observed. Similar results can be achieved for conditions in the sub-monolayer regime—both the monolayer and sub-monolayer regimes are found to not produce surface haze. A final aqueous rinse step is conventionally required to remove the buildup of products on the surface which can occur for samples etched in the condensed regime and under some circumstances in the multilayer regime. The invention eliminates the need for such by employing monolayer or sub-monolayer etch conditions that suppress the pitting mechanisms. Similarly, the invention reduces the need for wafer rotation during an etch process to enhance the mass transfer rate or to enhance the uniformity of mass transfer across an etching layer; even without such enhancements, the monolayer and submonolayer etch regimes of the invention are found to provide more uniform etch results.

EXAMPLE 12

Native oxide removal is a critical requirement for complete cleaning of silicon wafers, as explained above. The effectiveness of multilayer and monolayer HF vapor etching of native oxide silicon layers was compared with that of aqueous HF etching. Three silicon wafers, each with a native oxide layer having a thickness of about 20 Å were subjected to exposure to either a liquid-phase HF etch, a multilayer HF vapor etch, or a monolayer HF vapor etch. The liquid-phase HF was carried out with a 10:1 diluted HF solution. For this aqueous process, the wafer was immersed in the diluted solution for 1 min, followed by a dionized water rinse and conventional spin drying. Hydrophobicity was observed visually on the silicon surface at the completion of the liquid-phase etch.

The multilayer native oxide etch was carried out under conditions of 40° C., 125 T total pressure, 500 sccm total gas flow rate, 10 T HF vapor partial pressure, and 4 T water vapor partial pressure. The monolayer native oxide etch was carried out under conditions of 90° C., 125 T total pressure, 500 sccm total gas flow rate, 10 T HF vapor partial pressure, and 4 T water vapor partial pressure. These conditions border the monolayer and sub-monolayer regimes. Because the kinetics of the monolayer and sub-monolayer regimes are similar, similar results are found to be obtained for both regimes, but with lower etching rates and better control in the sub-monolayer regime.

Referring to FIGS. 9A–9D, there are shown the relevant XPS spectra measured at the completion of the native oxide etches. The multilayer and monolayer HF vapor processes were found for all considerations to be superior over a liquid-phase process. The Si—O peak was still observable after liquid HF etching, but not found for either of the HF vapor processes. Unlike the vapor-etched wafers, the wafer etched in the liquid-phase HF exhibited substantial oxygen after the etch. This result could have been due to imperfect removal of the native oxide by the etch or due to immediate native oxide regrowth by exposure to the ambient.

The absolute amount of carbon was reduced after all of the etch processes; but carbon contamination was observed for the aqueous process, at a higher binding state, indicating that a fluorocarbon contaminant was likely contained in the HF etch solution. Finally, the fluorine remaining on the wafer after the native oxide etch was found to be dramatically higher for the liquid-phase etch than for the vapor-phase etches. These comparisons illustrate that contamination can be minimized during native oxide removal through the use of multilayer, preferably monolayer, and most preferably sub-monolayer, rather than liquid-phase, HF processes.

EXAMPLES 13–15

Tetraethylorthosilicate (TEOS) is commonly employed as an interlayer dielectric material between metal lines due to the ability to deposit TEOS layers at relatively low temperatures, thereby adding little to the thermal budget of a semiconductor fabrication sequence. Cleaning of exposed metal and semiconductor contact areas is required to remove oxides on the metal and substrate and enable the formation of a via to an adjacent metal line. Such cleaning is required to be done with the interlayer metal dielectric exposed.

The etch characteristics of TEOS were investigated for multilayer, monolayer, and sub-monolayer HF vapor process regimes. Layers of TEOS were deposited by plasma enhanced chemical vapor deposition on silicon wafers. No annealing of the films was carried out.

HF vapor etching of the TEOS films was carried out for three different partial pressure combinations of HF and water vapor; 5 T and 10 T for the HF vapor, and 4 T and 8 T for the water vapor, as indicated on the plot. The total pressure of about 125 T was used for these processes with total flow rates of about 500 sccm.

Figure 10:
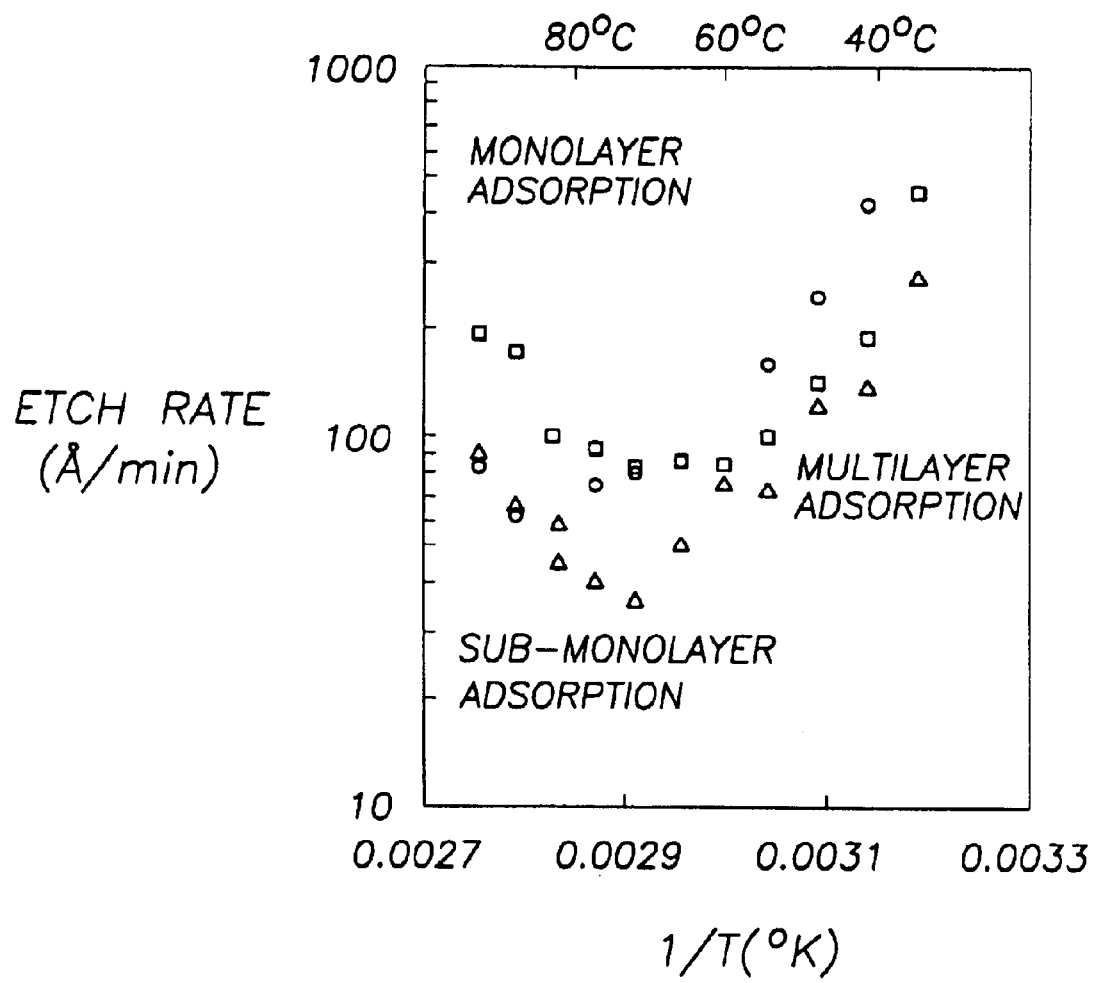
FIG. 10 is an Arrhenius plot of measured etch rate of a Tetraethylorthosilicate (TEOS) layer of in Å/min, as a function of temperature, for etch conditions in the multilayer, monolayer, and sub-monolayer HP process regimes.

FIG. 10 is an Arrhenius plot of the etch rate of the TEOS layers as a function of temperature for the three partial pressure combinations. Ellipsometric measurements were employed to determine the plotted etch rates. Comparing this plot with the Arrhenius plot of FIG. 5, it is found that the TEOS and thermal oxide film vapor etch mechanisms follow substantially identical trends. In the monolayer regime, the TEOS is found to etch about 2–3 times faster than thermal oxide for the same process conditions, while in the multilayer regime, the TEOS is found to etch about 10 times faster than thermal oxide for the same process conditions.

Low etch selectivity between TEOS and thermal oxide is generally favored for cleaning metal contacts, while high selectivity is often desired for selectively removing TEOS from a site. The monolayer and submonolayer regimes are thus found to be well-suited for metal contact cleaning. It is expected that if the TEOS films employed in these experiments had been densified by a heat treatment such as annealing, an even lower selectivity between TEOS and thermal oxide would have been obtained.

EXAMPLES 16–18

Any process that is performed for cleaning metal contacts inherently exposes the metal material, which commonly is aluminum. This is specifically the case for the removal of polymer residue that can remain at the edges of a metal line after a plasma etching process is carried out to pattern metal lines with a photoresist mask. Frequently, polymer residue remains at the edges of an etched metal line even after a plasma ashing procedure is completed. The polymer residue must be removed prior to subsequent processing as it would critically contaminate processing equipment. Liquid-phase diluted HF solution is known to be a good polymer remover, but it corrodes and etches aluminum rapidly.

The degree of attack of a thin aluminum layer by vapor HF etch processes was investigated for the condensed layer, multilayer, and monolayer regimes. For each regime, a layer of thermal oxide of about 5500 Å in thickness was formed on a silicon wafer and a layer of aluminum having a thickness slightly less than about 20 Å was deposited on the oxide layer. This thickness was selected because of its transparency for enabling determination of the thickness of the underlying oxide layer by ellipsometric measurement. The aluminum deposition was performed in the same vacuum cluster processing system with vacuum transfer between chambers, thereby preventing oxidation of the aluminum by air.

For the condensed layer regime, the process conditions of the etch were set at a temperature of 40° C., a total pressure of 125 T, a total flow rate of 500 sccm, an HF vapor partial pressure of 40 T, and a water vapor partial pressure of 10 T. For the multilayer regime, the process conditions of the etch were set at a temperature of 40° C., a total pressure of 125 T, a total flow rate of 500 sccm, an HF vapor partial pressure of 10 and a water vapor partial pressure of 4 T. For the monolayer regime, the process conditions of the etch were set at a temperature of 90° C., a total pressure of 125 T, a total flow rate of 500 sccm, an HF vapor partial pressure of 10 T and a water vapor partial pressure of 4 T.

Figure 11A:
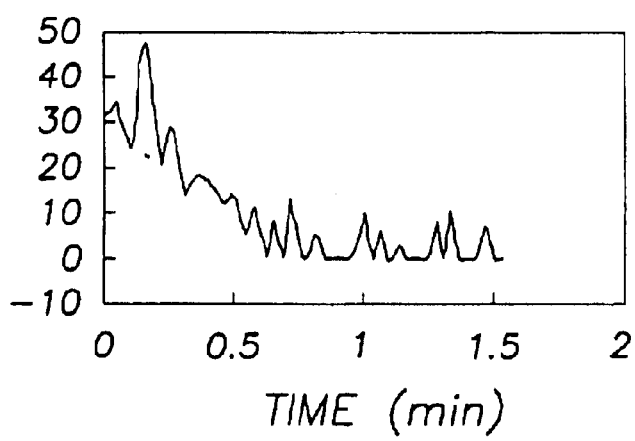
FIGS. 11A–11C are plots of measured ellipsometric signal angle, Psi, in degrees, as a function of time, in minutes, for three processes in which an oxide layer and overlaying aluminum layer are exposed to an HF vapor process carried out under condensed layer conditions, under multilayer conditions, and under monolayer conditions of the invention, respectively.

FIG. 11A is a plot of the ellipsometric signal at a wavelength of 4052 Å as a function of time for the condensed layer etch process. From the plot it was determined that the oxide underlying the aluminum layer was etched immediately upon exposure to the condensed regime conditions, and was etched at a rate of about 10,000 Å/min. This result corresponds to that of aqueous HF and indicates the incompatibility of condensed layer processing with exposed aluminum.

Figure 11B:
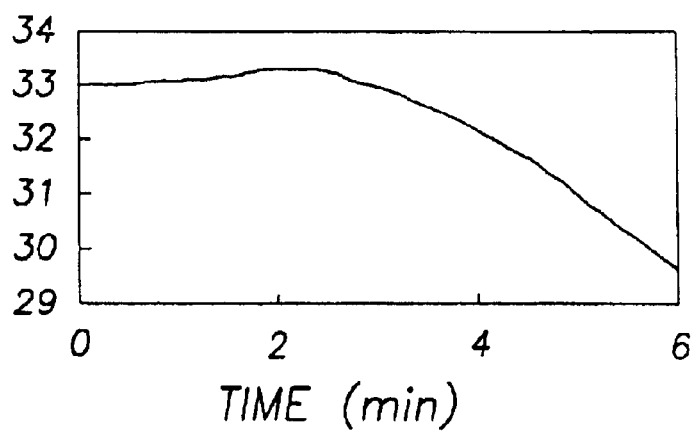

FIG. 11B is a plot of the ellipsometric signal at a wavelength of 4052 Å as a function of time for the multilayer etch process. An initial etch inhibition period of just about 3 min was followed by oxide etch at a relatively slow rate. This suggests that for the multilayer regime, the thin aluminum layer was not etched as rapidly as in the condensed layer regime, but that that HF molecules adsorbed on the aluminum layer penetrated the layer, resulting in a slow etch of the oxide.

Figure 11C:
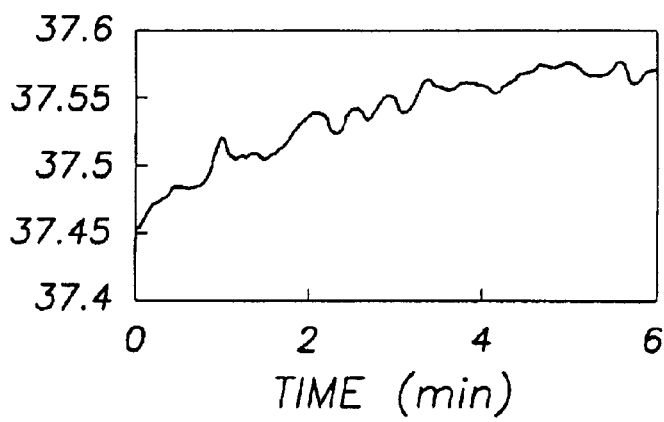

FIG. 11C is a plot of the ellipsometric signal at a wavelength of 4052 Å as a function of time for the monolayer etch process. As indicated in the plot, the signal changed less than about 0.2 degree for the entire 6 minute-long etch process. This suggests that neither the aluminum layer nor the underlying oxide layer were damaged by the monolayer HF exposure, and therefore that a monolayer HF vapor process can safely be employed to remove residue after metal patterning. The elimination of a rinse step through the use of a vapor process is also benefit in reducing the potential of metal corrosion. It is also understood that the HF vapor process could provide a further benefit by inherently producing a protective fluorinated layer on the surface of the metal.

Turning to further aspects of the invention, there is provided an optional first step of cleaning a wafer or an oxide layer to be processed by an HF vapor process with an ice jet, e.g., a jet of $CO_2$: $CO_2$ ice jet wafer cleaning is a known surface cleaning method employing a high-velocity stream of carbon dioxide directed at a wafer surface. This procedure can be employed for at least partially removing carbon contamination as well as particulates from a wafer surface.

The inventors herein have determined that carbon and particulate contamination does not substantially impact the etch rate and etch uniformity of HF vapor processes carried out in the condensed layer and multilayer processing regimes, as the etching kinetics in these regimes are less sensitive to surface contamination. In contrast, etch mechanisms carried out in the sub-monolayer and monolayer regimes can be substantially inhibited or enhanced by carbon and particulate contamination, both in an unpredictable manner. This is due to the high degree of sensitivity of the sub-monolayer and monolayer regimes to the chemical and electrical characteristics of species adsorbed on the surface, given that these regimes are surface reaction limited. As a result, the inventors have recognized that the repeatability of monolayer or sub-monolayer HF vapor processes carried out on contaminated wafers or oxide layers can be very poor.

The inventors have discovered the surprising result that an initial ice jet cleaning of a carbon-contaminated wafer or oxide layer, even if not complete, reduces the contamination to a level that does not impact the efficacy or uniformity of etch processes in the sub-monolayer and monolayer regimes. In other words, it has been discovered that contrary to conventional wisdom, the surface-reaction limited sub-monolayer and monolayer regimes can proceed on a contaminated surface in a uniform and predictable manner, if the surface is first exposed to an ice jet cleaning procedure. The invention thus provides for ice jet cleaning processes using $CO_2$, Ar, or other suitable gas to prepare a wafer or oxide layer for cleaning or etching in the monolayer and sub-monolayer regimes.

The ice jet cleaning step of the invention consists of directing a high-velocity stream of small dry ice crystals toward a wafer or oxide surface. Such crystals can be formed by, e.g., the expansion of high-pressure liquid or gaseous carbon dioxide from a small orifice. Adiabatic expansion of the liquid or gas generates a temperature drop within the orifice that is sufficient to produce nucleation of small dry ice particles. Preferably, there is provided for this expansion a source of carbon dioxide liquid or gas, e.g., gas at a pressure at about 830 psi. It can be preferable to provide a dip tube that allows withdrawal of the $CO_2$ directly from inside a gas storage cylinder, but other arrangements are also suitable.

A wafer to be cleaned by the ice particles is positioned on, e.g., an aluminum sample holder on which the wafer is held by, e.g., a vacuum suction contact. For some wafer cleaning processes, it can be preferable to prevent condensation of water on the wafer due to excessive cooling by the $Co_2$; such can be accomplished by, e.g., providing a wafer holder that is thermally conducting and that is connected to, e.g., a heating block for heating the wafer during the cleaning step.

In carrying out the ice jet cleaning procedure, it is preferable to first initiate the ice jet formation out of the nozzle with the nozzle directed away from the wafer to be cleaned. Once an ice stream is formed and stabilized, the ice jet stream is then preferably swept from side to side across the entire wafer area. An incident ice jet stream angle of between about 30° and about 45° to the normal to the surface, and a nozzle-to-surface distance of between about 1" and about 1.5", is preferred. For a 4" wafer, ice jet exposure of the entire wafer should take between about 3 min and about 4 min. It is recognized that the use of a gas knife nozzle, in which a broad source of the ice jet can be produced, can be employed to enable a more rapid processing of the wafer.

The force of adhesion between submicron-sized particles and a wafer or oxide surface is typically much larger than the drag force of conventional fluid-based cleaning. But for the ice jet cleaning process, the cleaning mechanism is primarily by momentum transfer between the ejected ice particles and contaminants on the wafer surface. As a result, the small ice particles from the jet stream can overcome the particle adhesion force and free the particles from the surface by this momentum transfer.

It is also found that the ice jet stream sweeps away removed particle contamination, removing it from the wafer environment. Thick deposits of hydrocarbon are partially removed by interaction of the ice particles with the ice jet crystals, but some hydrocarbon contamination generally remains after ice jet processing. Similar mechanisms for particulate contamination removal and hydrocarbon removal take place in ice jets created from other gases such as Argon, therefore, their use as a pretreatment for the monolayer and sub-monolayer regimes is contemplated by the invention. Additional details for carrying out ice jet processing are provided by Tamai et al., in U.S. Pat. No. 5,512,106, Apr. 30, 1996; by Whitlock et al., in U.S. Pat. No. 4,806,171, Feb. 21, 1989; and by Ohmori et al., in U.S. Pat. No. 5,147,466, Sep. 15, 1992; the entirety of all of which are hereby incorporated by reference.

EXAMPLE 19

A layer of thermal oxide of about 5000 Å in thickness was formed on each of two silicon wafers and a finger print was made on the oxide surface of each. Prior to making the finger print, the carbon 1s XPS spectra of the two oxide surfaces was profiled. With the finger print in place, the two oxide layers were subjected to a $CO_2$ ice jet cleaning step following the procedures given above. The XPS spectra was then profiled. One of the wafers was then subjected to a multilayer HF vapor process, at conditions of HF vapor partial pressure at 10 T, water vapor partial pressure at 4 T, total pressure at 125 T, flow rate at 500 sccm, and temperature at 40° C. The other wafer was subjected to a monolayer HF vapor process, at conditions of HF vapor partial pressure at 10 T, water vapor partial pressure at 4 T, total pressure at 125 T, flow rate at 500 sccm, and temperature at 90° C. Each of the HF vapor processes were carried out for 2 minutes, etching about 200 Å of oxide during that time.

Each of the oxide layers was inspected at the completion of the $CO_2$ cleaning step and at the completion of the HF vapor processing steps. It was found that remnants of the finger print remained using XPS on the oxide layer after the $CO_2$ cleaning step. It was surprisingly found that the remnant of the fingerprint did not alter the removal of the underlying oxide layer processed in the monolayer HF vapor regime and that the oxide layer was uniformly etched in the monolayer regime after the ice jet exposure. In fact, such contamination was found to be removed by the HF process in both the monolayer and sub-monolayer regimes. This validates the unexpected discovery by the inventors that the ice jet cleaning process synergistically cooperates with the surface-reaction limited monolayer and sub-monolayer HF vapor processes to enable uniform etching of those processes even in the presence of surface contamination.

In general, monolayer and sub-monolayer surface kinetics are significantly affected by contaminants such as hydrocarbons that block the surface preventing adsorption of the reactants. Thick carbonaceous deposits have been reported to accelerate the etching rate of underlying oxides by absorption of the reactants within the carbonaceous deposit. It is therefore surprising that the contamination left after $CO_2$ cleaning did not alter the etching of the underlying oxide. This discovery indicates that the general benefits of processing in the sub-monolayer and monolayer regimes can be extended even to wafers and oxide layers having carbon contamination, in contradiction to theoretical prediction.

Figure 12:
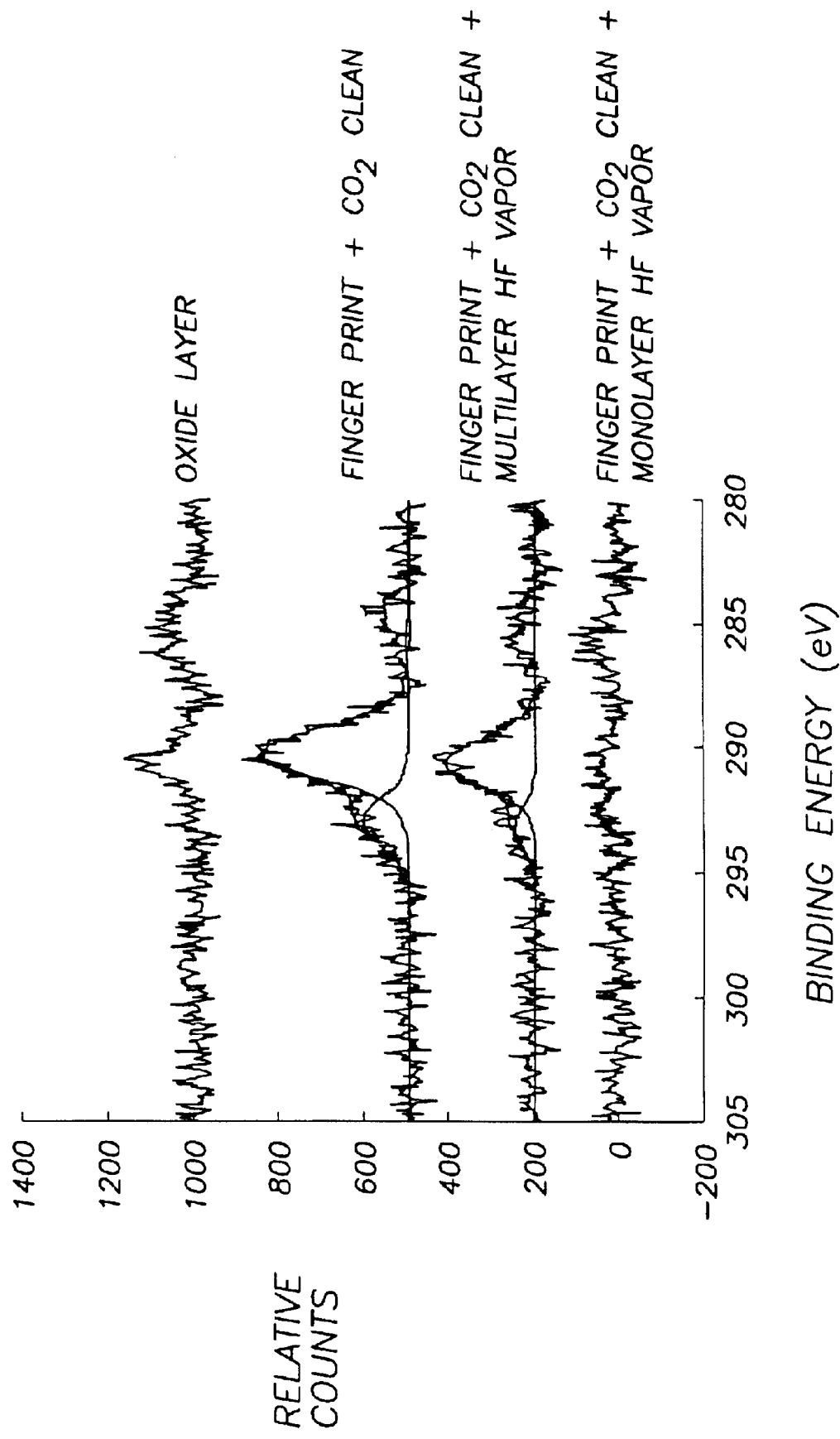
FIG. 12 is an XPS plot of measured relative counts as a function of binding energy, in eV, centered on the energy corresponding to C 1s bonds, for a thermal oxide layer, for a finger print on a thermal oxide layer that has been subjected to a $CO_2$ cleaning step, for a finger print on a thermal oxide layer that has been subjected to a $CO_2$ cleaning step and multilayer regime HF vapor process in accordance with the invention, and for a finger print on a thermal oxide layer that has been subjected to a $CO_2$ cleaning step and a monolayer regime HF vapor process in accordance with the invention.

FIG. 12 is an XPS plot of measured relative counts for the energy region corresponding to carbon Is from the finger print. The carbon peak is shifted to 290 eV from its expected energy of 285 eV due to an electrical charging effect of the XPS measurement. The plot highlights the finding that the monolayer regime was found to be more effective than the multilayer regime at cleaning residual carbon remaining after the ice jet step. In combination with the etch uniformity visually confirmed, it is understood in accordance with the invention that the surface-reaction limited monolayer and sub-monolayer process regimes are superior for providing etch control and uniformity even in the presence of carbon contamination. This finding indicates that the sub-monolayer and monolayer HF vapor processes of the invention are particularly well-suited for removing polymeric residue from a plasma-etched layer, given that the main constituents of such residue are carbon and silicon dioxide.

The invention provides further techniques for controlling HF vapor process mechanisms. Specifically, there is provided the parameters for an initial step of electrically charging or discharging an oxide layer surface to control the etch rate of the oxide layer by an HF vapor process in a repeatable, predictable manner. Handling history, cleaning processes, ambient conditions, and many other factors are recognized to all impact the electrical charge state and corresponding HF vapor etch rate of an oxide layer. The prespecified and controlled charge preparation step provided by the invention compensates for such factors to render an HF vapor oxide etch process predictable and repeatable.

The impact of a particular oxide layer charge polarity on etch rate of the oxide layer is dependent upon the particular operating regime in which the HF vapor process is set to proceed. Two etch states are defined in accordance with the invention: a nonactivated, low-etch rate state, produced by an initial electrical discharge step, and an activated, high-etch rate state, produced by an initial electrical charging step. Given the demonstrated benefits of the non-condensed sub-monolayer, monolayer, and multilayer HF vapor regimes and their preference in accordance with the invention, the invention provides particular charging and discharging parameters for these particular regimes.

The inventors herein have discovered that for any of the three non-condensed regimes, a nonactivated, low-etch rate state of a given regime can be predictably carried out on an oxide layer by first discharging any static charge build-up that might be present on the oxide layer surface. For the sub-monolayer and monolayer regimes, an activated, high-etch rate state process can be carried out on an oxide layer by first electrically charging the oxide surface with a positive polarity charge. Intermediate charging of the surface can produce etching rates that have intermediate etching rates. For the multilayer regime, an activated, high-etch rate state process can be carried out on an oxide layer by first electrically charging the oxide surface with a negative polarity charge. Each of these techniques are described in turn below.

Considering first the sub-monolayer and monolayer regimes, a positive electrical charge can be imparted to the surface of an oxide layer to be etched in one of these two regimes by a range of techniques provided by the invention. In a first technique, the oxide layer surface is exposed to a conventional electron beam irradiation scan. For example, a high-energy electron beam, characterized by, e.g., a 10 KeV accelerating voltage and 25 $\mu$A emission current, with a spot size of about 1 cm in diameter, can be employed to irradiate an oxide surface. The beam is scanned across the surface, for a total irradiation time of, e.g., about 30 minutes. The electron beam scan is understood to charge the oxide surface with a positive polarity due to generation of secondary electrons from the oxide surface.

Exposure of an oxide layer surface to UV irradiation can also be employed for producing a positive electrical charge on the surface. In accordance with the invention, a UV source is directed toward an oxide surface through a metal screen that is electrically biased by a DC voltage source. The screen is preferably separated from the oxide surface by a gap of about 1 inch. The polarity of the DC bias has no effect on the electrical charging process. It is understood that the UV source introduces sufficient photon energy to excite and free the surface electrons of an oxide layer, resulting in a positively charged surface state.

A positive surface charge can also be imparted to an oxide layer by processing the layer in a plasma chamber. In a first plasma charging process provided by the invention, a wafer including an oxide layer is supported on the lower metal electrode of the chamber with the wafer insulated from the electrode by an insulating layer such as Kapton tape, a configuration used to electrostatically clamp the wafer to the electrode. The DC power supplied to the lower electrode is set with a negative bias. Plasma processing conditions can be set as, e.g., 1000 V DC voltage, 150 W RF power, 10 mT pressure, and 10 sccm flow of an inert gas such as argon. A plasma process time of less than 1 min is needed to produce an oxide surface charge. Less than about 100 Å of oxide are etched during this duration for the process conditions given. With a plasma initiated, the metal electrode and insulated wafer together form a capacitor in which positive electrostatic charge is accumulated on the oxide layer surface.

The $CO_2$ ice jet cleaning procedure described previously can also be employed to impart a positive electrical charge to an oxide surface. It is required that the wafer be heated during the ice jet cleaning to produce the positive charge state. This can be accomplished, as described above, by maintaining the wafer on a thermally conductive support block to which a heater is connected during sweep of an ice jet over the oxide layer surface. With this configuration, the ice jet process given above results in positive oxide surface charging.

A positively charged oxide surface can be produced by a variety of other techniques. In one particularly simple technique, a sheet of clean room grade Kimwipes® or other such anti-static material can be wiped across the surface of the oxide layer to impart a positive electrical charge to the layer. The anti-static coating of the material is found to generate a positive charge on the oxide surface.

These examples provide a description of several efficient and simple charging techniques. It is to be understood that other techniques can be employed to impart a positive electrical charge to an oxide surface, and the invention is not limited to a particular technique.

Electrostatic charge release of an oxide layer can be accomplished in accordance with the invention by a variety of techniques. In a first technique, charge is released by a water rinse of the oxide surface. The electrical conductivity of water is understood to enable the release of charge from the layer. In a further charge release technique, the $CO_2$ ice jet cleaning process described earlier is carried out on an unheated wafer, i.e., condensation is permitted during the ice jet process. As a result, charge is removed by the adsorbed species and swept away with the species by the jet stream. It is to be recognized that other techniques can be employed to release charge from an oxide surface. The invention is not limited to a particular charge release technique.

EXAMPLES 20–21

A thermal oxide layer was formed on a plurality of silicon wafers. Half of the oxide layers were treated by wiping a Kimwipes® cloth over their surfaces to impart a positive electrical charge to the surface. The remaining oxide layers were subjected to a $CO_2$ ice jet cleaning while unheated, to release electrostatic charge from their surfaces. One quarter of the charge oxide layers and one quarter of the uncharged oxide layers were subjected to HF vapor process conditions of a partial pressure of HF vapor of 10 T, a partial pressure of water vapor of 4 T, a total flow rate of about 500 sccm and a total pressure of about 125 Torr at a variety of temperature conditions. One quarter of the charge oxide layers and the final quarter of uncharged oxide layers were subjected to HF vapor process conditions of a partial pressure of HF vapor of 20 T, a partial pressure of water vapor of 8 T, a total flow rate about 500 sccm and a total pressure of about 125 Torr.

Figure 13:
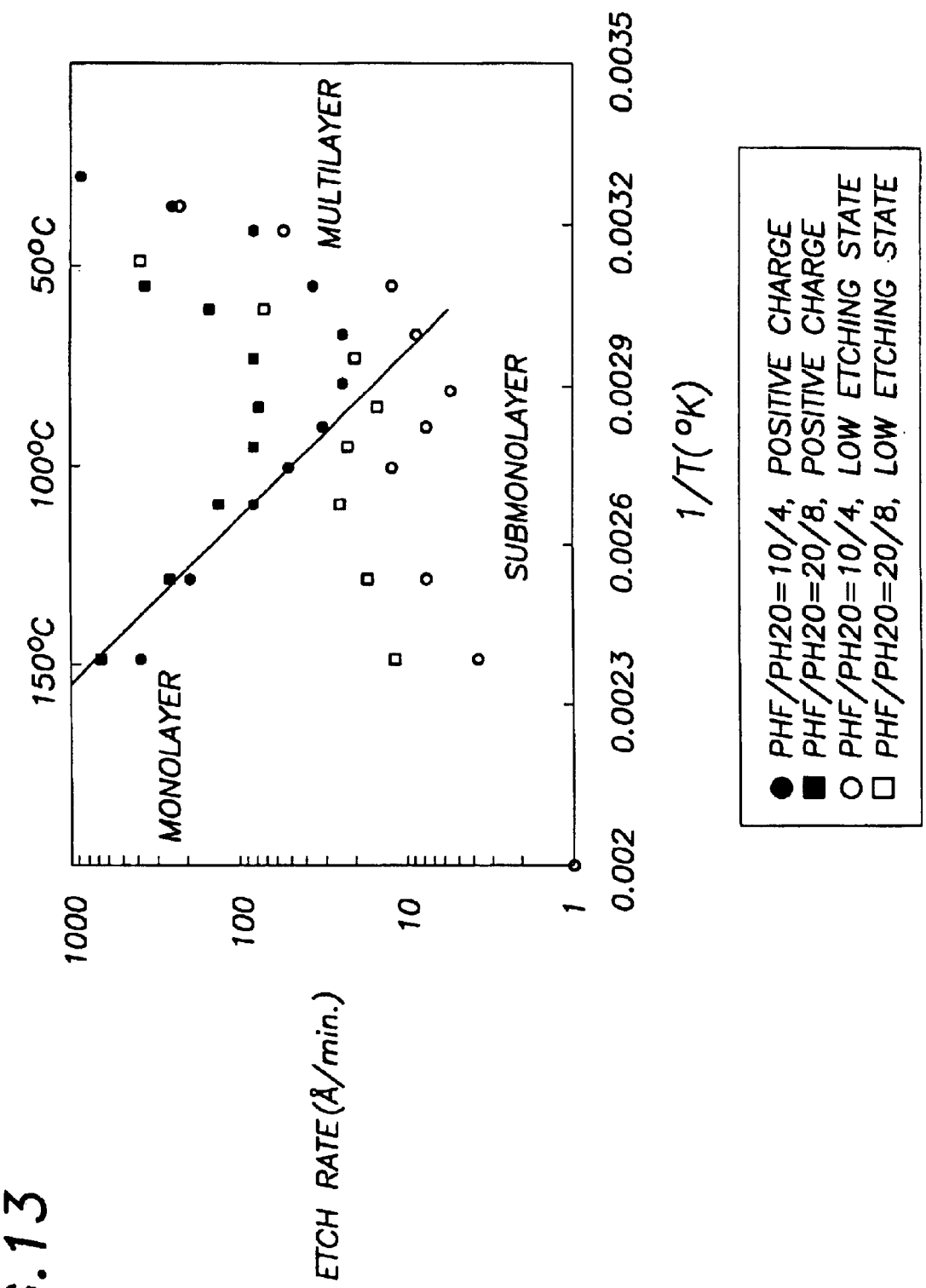
FIG. 13 is an Arrhenius plot of measured etch rate, in Å/min, as a function of temperature, for an oxide layer surface which has been positively precharged and for an oxide surface that has been electrically discharged, for two HF vapor etch conditions that include processes in the multilayer adsorption regime, the monolayer adsorption regime, and the sub-monolayer adsorption regime of the invention.

The etch rate of each of the vapor processes was determined based on ellipsometric measurements taken during the processes. FIG. 13 is an Arrhenius plot of etch rate, in Å/min, as a function of process temperature, for the two different process conditions and the two different surface charge conditions. It is clearly indicated from the plot that for the sub-monolayer and monolayer process regimes, the positive surface charge resulted in an etch rate increase; this increase was most dramatic for the sub-monolayer regime temperatures, at which a rate increase of a factor of almost 100 is found. The positive surface charge had very little, if any, impact on the etch rate in the multilayer regime, however. These results were reflected in the plots of FIGS. 5, 6, and 10 described above, where it was indicated that an initial positive polarity electrical surface charge was produced prior to the etch processes.

It is believed that the positive oxide surface charging enables direct ionization of vapor HF adsorbed on the oxide surface, leading to an increase in the rate of the oxide etch reaction. This is consistent with the fact that the monolayer regime is dependent on surface reaction kinetics and that the sub-monolayer regime is very strongly dependent on surface reaction kinetics.

EXAMPLES 22–23

The plot of FIG. 13 also highlights the impact of positive surface charging on the vapor process dependence on HF vapor partial pressure. For the process temperatures in the sub-monolayer and monolayer regimes between approximately 125° C. and 150° C., it is found that for the electrically charged oxide layers, a doubling of HF and water partial pressures from 10 T to 20 T and 4 T and 8 T, respectively, results in a doubling of the etch rate. Conversely, for the uncharged oxide layers, a doubling of the HF and water partial pressures from results in an etch rate increase by a factor of between three and four.

This correspondence was further investigated. Thermal oxide layers were produced on silicon wafers and all were positively charged by wiping their surfaces with an antistatic cloth. The wafers were then subjected to w HF vapor processes carried out in the sub-monolayer regime, at a temperature of 145° C., a total flow rate of 500 sccm, and a partial pressure of water vapor of 4 T. The partial pressure of the HF vapor was varied from process to process. The etch rate of each process was determined based on ellipsometric measurements taken during each process.

Figure 14A:
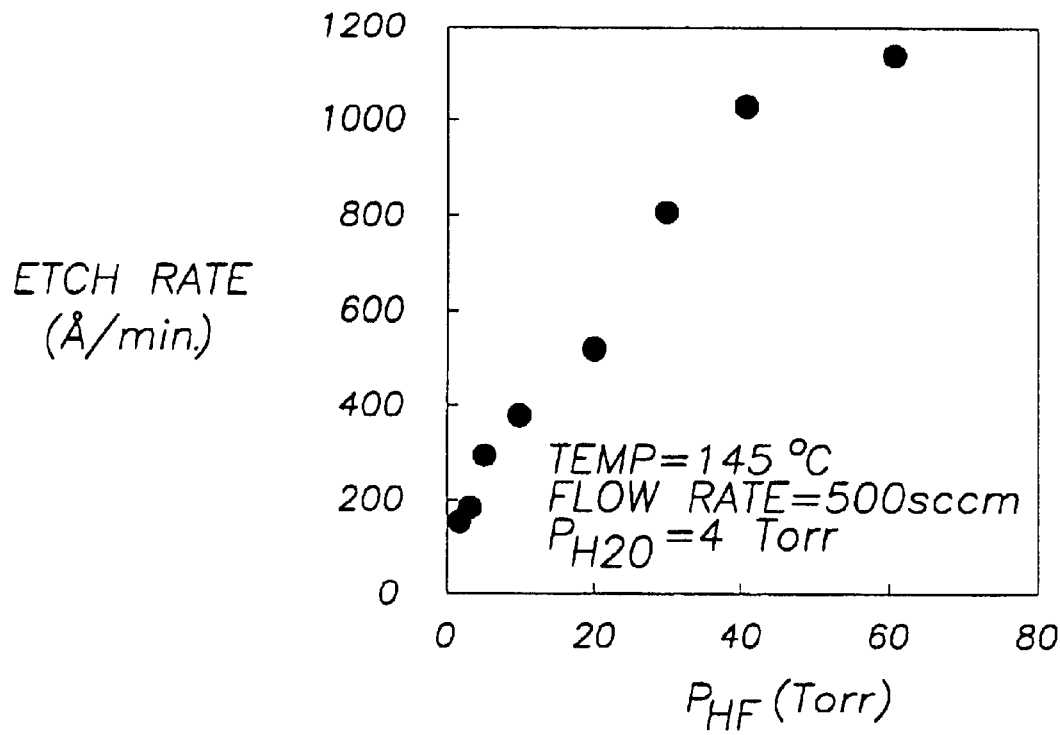
FIG. 14A is a plot of measured etch rate, in Å/min, as a function of HF vapor partial pressure, for the process conditions indicated, for an oxide layer that has been positively charged in accordance with the invention.

FIG. 14A is plot of oxide etch rate, in Å/min, as a function of HF vapor partial pressure, measured for the positively charged oxide layers. This matrix of experiments confirms that in the charge-activated, high-etch rate state, the etch rate of the sub-monolayer and monolayer regimes is directly proportional to the HF partial pressure, following simple first order Langmuir adsorption kinetics.

Figure 14B:
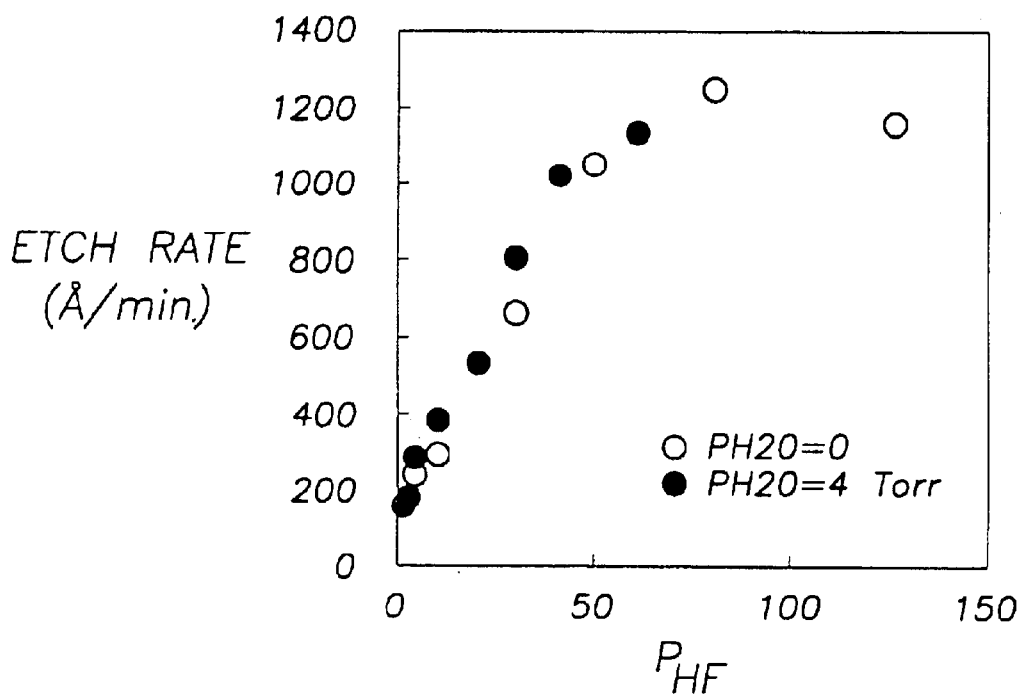
FIG. 14B is a plot of measured etch rate, in Å/min, as a function of HF vapor partial pressure, including the data of the plot of FIG. 14A and for an process not employing water vapor for etching an oxide layer that has been positively charged in accordance with the invention.

The data from FIG. 14A is replotted in FIG. 14B, which also includes etch rate data for a process employing the same process conditions as those relating to the data of FIG. 14A but with no water vapor introduced during the vapor process. Under these conditions and for low HF partial pressures, there is seen to be no substantial difference between the etch rates. This indicates that for positively charged oxide layers being etched under these conditions in the sub-monolayer or monolayer regimes, the effect of water vapor partial pressure is negligible for low pressures and for low water vapor pressures. It is to be recognized, however, that under other conditions, the water vapor partial pressure significantly affects the etch rate in the monolayer and sub-monolayer regimes with positive charge enhancement of the etch rate. The plotted data of FIGS. 5, 6, and 10 confirm this, given that a positive charging of the oxide surface was used to obtain the high etching rate state of those reported experiments.

EXAMPLE 24

The dependence of etch rate on HF vapor partial pressure was also directly investigated for the sub-monolayer and monolayer regimes of etching of uncharged oxide layers. Thermal oxide layers were produced on silicon wafers and subjected to a water rinse to enable release of charge from the oxide surface. The oxide layers were then exposed to HF vapor conditions in the sub-monolayer regime, consisting of a total pressure of 125 T, a temperature of 145° C., a total flow rate of 500 sccm, and no water vapor. Each wafer was processed at a different HF vapor pressure.

Figure 15:
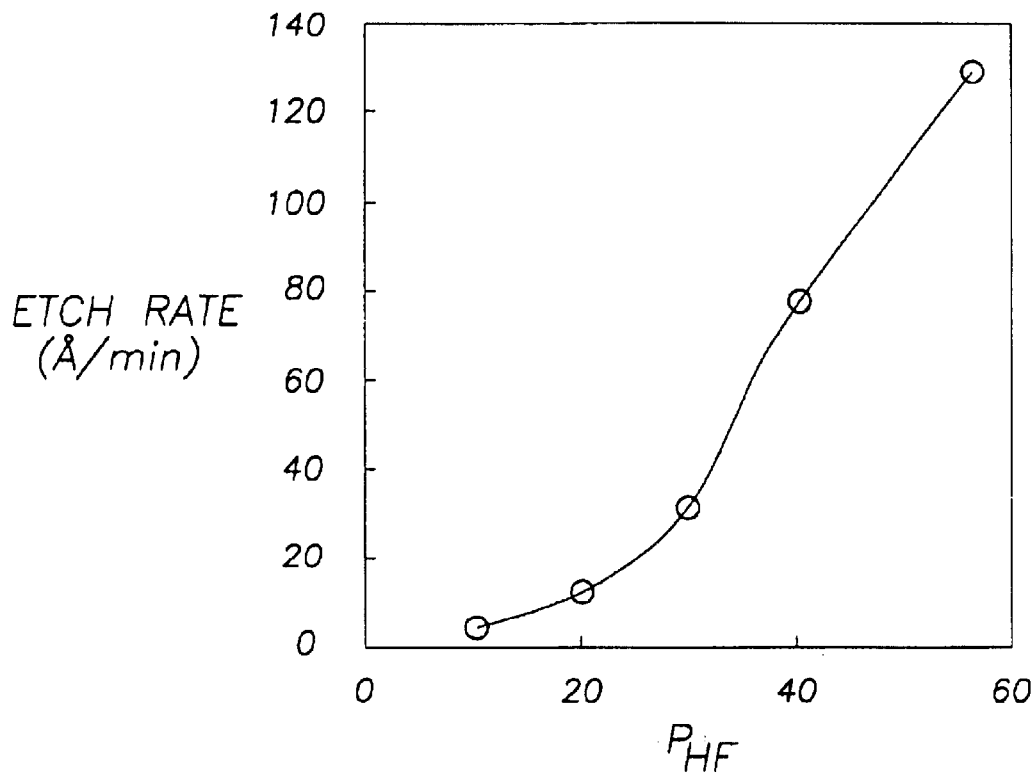
FIG. 15 is a plot of measured etch rate, in Å/min, as a function of HF vapor partial pressure, for an oxide layer that has been electrically discharged in accordance with the invention.

FIG. 15 is a plot of etch rate, in Å/min, as a function of HF pressure, determined based on ellipsometric measurements taken during the etch processes. As indicated by the plot, there is found to be a second order dependency of etch rate on HF vapor pressure for the non-charged oxide layers. This confirms the results plotted in FIG. 13, which also indicate a second order etch rate-HF vapor pressure dependency for the uncharged oxide layer conditions.

EXAMPLE 25

Characteristics of uncharged oxide etch processes in the sub-monolayer and monolayer regimes were further investigated. Thermal oxide layers were produced on silicon wafers and were water-rinsed to release any electrical charge that might be present. The wafers were then exposed to sub-monolayer and monolayer HF vapor conditions of a temperature of 90° C., a total pressure of 125 T, a total flow rate of 500 sccm, and a combined reactant partial pressure of 28 T. Each wafer process employed a different reactant ratio.

Figure 16:
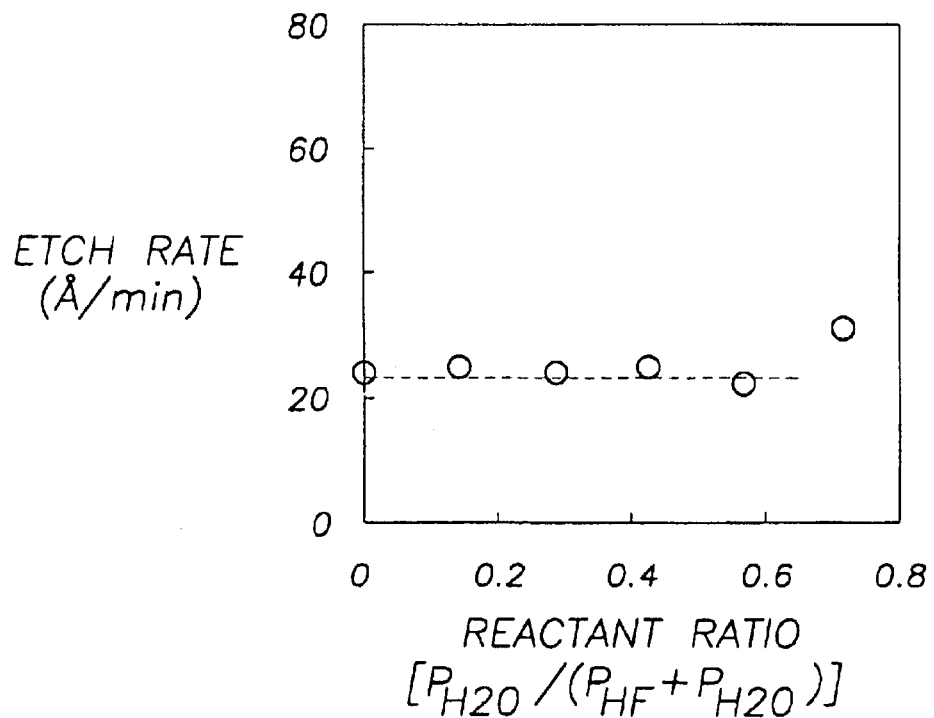
FIG. 16 is a plot of measured etch rate, in Å/min, as a function of the ratio of HF vapor partial pressure to total reactant pressure, for an oxide layer that has been electrically discharged in accordance with the invention.

FIG. 16 is a plot of etch rate, in Å/min, as a function of reactant ratio, based on ellipsometric measurements taken during the etch processes. For the non-activated, low-etch rate process data plotted, it is found that the etch rate is not impacted by the ratio of reactant partial pressures. This is in great contrast to the results obtained for the charged, activated process data presented in FIGS. 14A–14B, where it is indicated that the HF vapor partial pressure strongly influences the etch rate. Such is understandable given that the positive surface charging is found to directly ionize adsorbed HF species; a higher degree of HF adsorption would correspond to a higher etch rate.

These examples highlight the very clear process-dependent effects that can be relied on to distinguish the activated etch state from the non-activated etch state for the sub-monolayer and monolayer etch regimes. Positive charging of an oxide layer to an activated state results in an etch rate increase by a factor of about 5, and a shifting of the etch rate from a second order to a first order dependency on the partial pressure of HF vapor. The activated state is found to be closely impacted by HF vapor partial pressure, with no effect by water vapor pressure, while the non-activated state is found to be not impacted by the reactant partial pressure ratio. The positive charging is found to greatly impact the sub-monolayer and monolayer regimes but to have substantially no impact on the multilayer regime.

EXAMPLES 26–28

The impact of positive-polarity oxide layer charging was further investigated for HF vapor processes employing methanol and isopropyl alcohol instead of water vapor. Thermal oxide layers were grown on silicon wafers, and on half of the layers was produced a positive-polarity charge by wiping with a Kimwipese® cloth. HF vapor processes were carried out, with process conditions of the temperature at 95° C., the total flow rate of 500 sccm, a total pressure of 125 T, and a partial pressure of 20 T. Processes were carried out employing either water vapor, methanol, or isopropyl alcohol, all at a partial pressure of 8 T.

Figure 17:
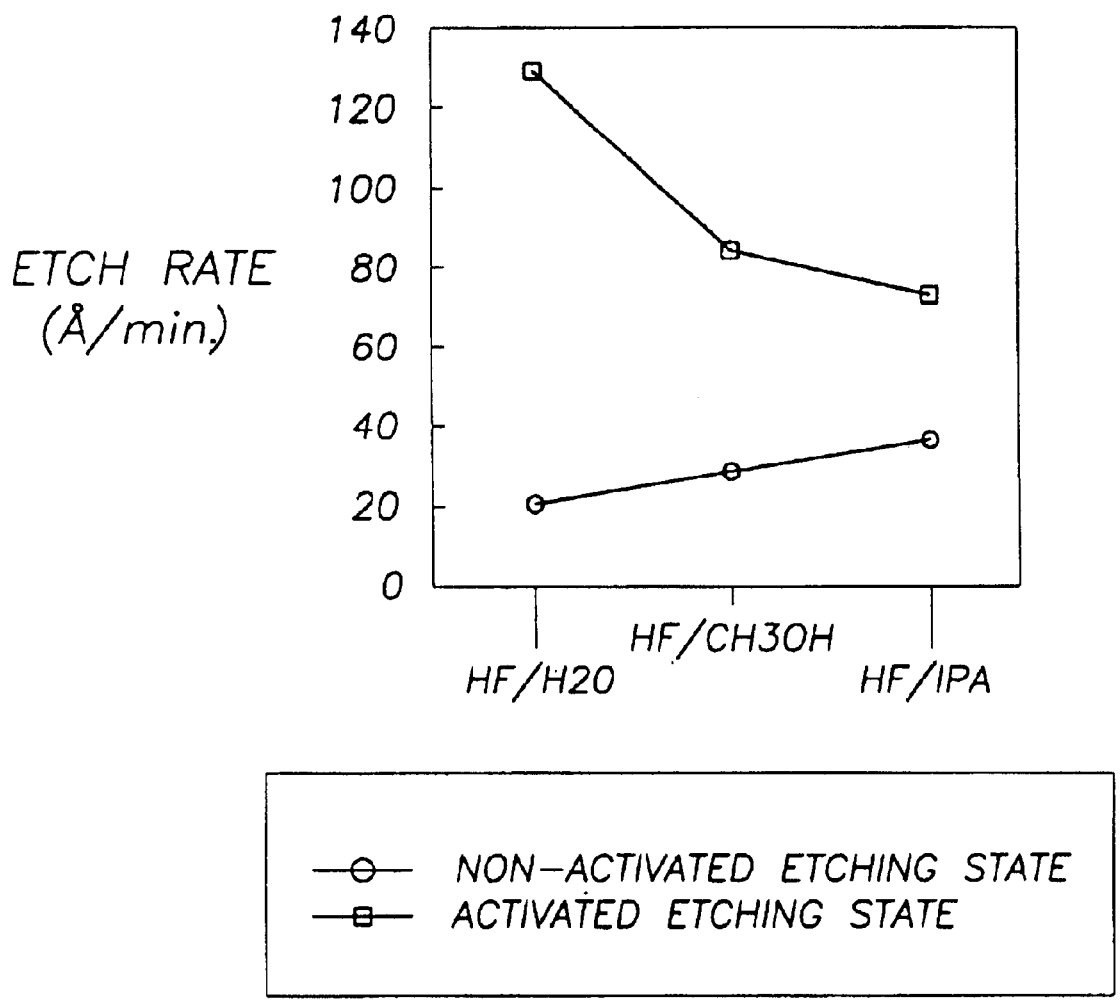
FIG. 17 is a plot of measured etch rate, in Å/min for three HF vapor processes, one employing water vapor, one employing methanol, and one employing isopropyl alcohol, all for an oxide layer that has been electrically discharged in accordance with the invention and for an oxide layer that has been electrically positively charged in accordance with the invention.

FIG. 17 is a plot of etch rate, in Å/min, for each the water vapor, methanol, and isopropyl alcohol processes, each for a non-activated, uncharged oxide layer and for an activated, positively charged oxide layer. The results indicate that the largest increase in etch rate by charge activation is achieved for an HF-water vapor process. In the non-activated state, the HF-isopropyl alcohol process results in the highest etch rate, while for the activated state, the HF-water vapor process results in the highest etch rate. This experiment verifies that a step of electrically charging or discharging an oxide layer prior to an HF vapor process can be employed to control the etch rate of the vapor process, including any of water vapor, methanol, or isopropyl alcohol with the HF vapor.

Turning to processes for producing the charged, activated state for the multilayer regime, the inventors herein have discovered that a negative electrical charging of an oxide surface results in activation of the surface for HF vapor etching in the multilayer regime. This is understood to enhance etch rate in the multilayer regime by enhancing the negative potential of the oxide surface, which in turn enhances adsorption of the polar reactant molecules on the oxide surface. Such enhanced adsorption is found to enable the formation of a multilayer that is thicker than that produced without oxide layer charging, and is due to the electrostatic enhancement of the adsorption energy of these molecules to the surface. The resulting thicker multilayer exhibits an etch rate higher than a thinner multilayer, as expected.

A negative charge can be imparted to an oxide surface by a variety of techniques provided by the invention. In a first technique, the plasma exposure process described above is employed with the DC voltage bias polarity reversed. Here a positive DC bias placed on the lower electrode of a plasma chamber on which a wafer is supported and insulated results in the generation of negative charge on the oxide layer surface. The plasma conditions given above, e.g., 10 sccm of argon flow, 150 W RF power, 10 mT pressure, and 1000 V DC bias, can be employed here for producing negative surface charge.

An asymmetric diode plasma reactor in which the wafer is mounted on the smaller electrode can also be employed to impart a negative electrical charge to an oxide layer surface. In this configuration, in, e.g., a reactive ion etcher or sputtering chamber, the wafer is mounted on the smaller electrode of the chamber to achieve an RF biasing of the electrode and resulting charging of the wafer surface. Using electrodes of differing areas in contact with the plasma results in a negative charge build up on the surface of an oxide layer on the wafer. Process conditions of, e.g., 30 W RF power to the bottom/smaller electrode, 30 mT of pressure, and 1 min of processing time in a sputtering chamber is sufficient to impart a negative charge to the surface of an oxide layer.

Negative charge can also be produced on an oxide layer by exposing the layer to a low energy electron beam. Conditions of, e.g., an accelerating voltage of about 100 eV and an emission current of about 1000 µA can be employed. Exposure of the surface to the beam conditions results in a negative charging of the oxide.

Negative charge build-up on an oxide layer surface can further be produced by exposure of the oxide layer surface to an HF vapor process followed by storage in a vacuum environment for at least about 2 hours. The preliminary HF vapor process can be employed as an initial partial etch of the layer. The HF vapor process is found to fluorinate the oxide surface, with the resultingly exposed fluorine atoms becoming negatively charged by electrons in the vacuum environment, e.g., from an ion gauge or low energy electron beam.

W It is to be recognized that there are a wide range of other processes for producing a negative surface charge on an oxide surface. The invention is not limited to a particular technique for producing a negative-charge build-up on an oxide layer surface.

EXAMPLES 29–30

Thermal oxide layers were produced on silicon wafers. Half of the oxide layers were rendered in a negative-charge activated state by exposing the oxide layers to a plasma environment of an argon flow rate of 20 sccm, a pressure of 30 mT, an RF power of 30 W, and a positively biased DC voltage applied to an electrostatically-clamped wafer holder with about 600 volts. The other oxide layers were rendered charge-free by a water rinse.

The oxide layers were subjected to HF vapor processes, all with an HF vapor partial pressure of 10 T, a water vapor partial pressure of 4 T, a total pressure of about 125 T and a total flow rate of 500 sccm. Each process was carried out at a different temperature.

Figure 18:
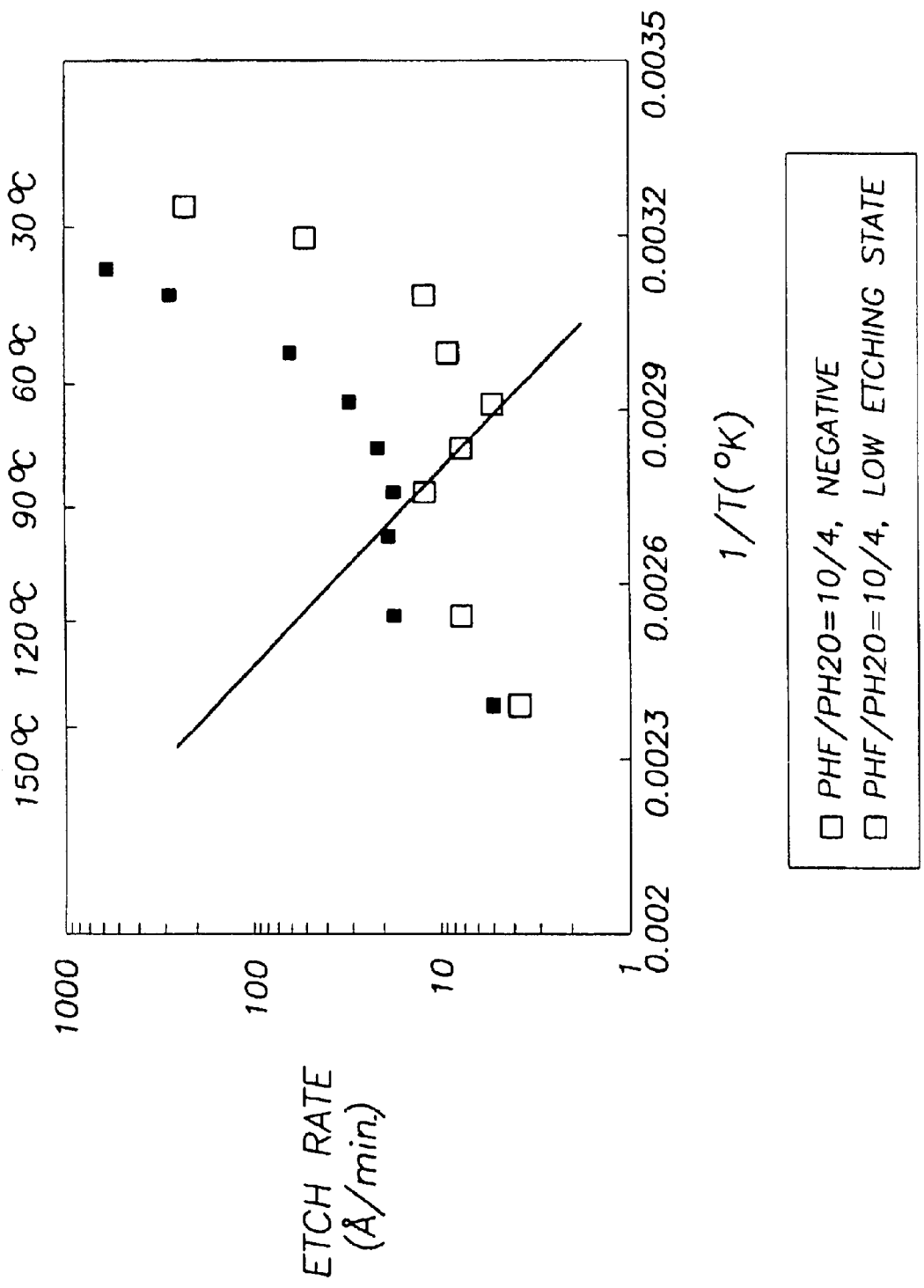
FIG. 18 is an Arrhenius plot of measured etch rate, in Å/min, as a function of temperature, for an oxide layer surface which has been negatively precharged and for an oxide surface that has been electrically discharged, for the HF vapor etch conditions indicated, that include processes in the multilayer adsorption regime, the monolayer adsorption regime, and the sub-monolayer adsorption regime of the invention.

FIG. 18 is an Arrhenius plot of etch rate, in Å/min, as a function of temperature, as-determined based on ellipsometric measurements taken during the vapor processes. As indicated by the data of the plot, etch processes in the sub-monolayer and monolayer regimes were not impacted by the negative oxide layer surface charging. The multilayer regime is found, however, to be significantly enhanced by the negative oxide layer surface charge.

It is also found, as further indicated by the plotted data, that the negative oxide layer surface charge results in an increase of the temperature of transition from the monolayer regime to the multilayer regime by about 20° C. This transition temperature shift is understood to result from an enhancement of reactant adsorption by reduced reactant vapor pressures for the etch processes carried out on the charged oxide surface.

It is contemplated in accordance with the invention that the various oxide layer charge conditions described above be directly measured. Such can be accomplished by conventional means for enabling a confirmation of the polarity of charge produced on a given oxide layer.

The examples given above demonstrate the advantages provided by the invention for controlling particular operating regimes of HF vapor processes. Sub-monolayer, monolayer, multilayer, and condensed layer operating regimes have been discovered by the inventors, and distinctive characteristics of each regime have been described to enable identification of the regimes. Specific pre-process steps are provided for enabling further control of the etch rate and for compensating for prior contamination.

For many applications, it is preferred in accordance with the invention to control an HF vapor process to proceed in the sub-monolayer or monolayer regimes. Being surface reaction rate limited, these regimes enable highly uniform etching, resulting in elimination of surface pitting and corresponding "haze" that is conventionally associated with etching in the multilayer regime. Furthermore, the formation of etch residue particulates is eliminated in the sub-monolayer and monolayer regimes by the complete and immediate evaporation of process products during an etch reaction.

Processes in the sub-monolayer and monolayer regimes are found unexpectedly to proceed uniformly, even on silicon wafer surfaces exhibiting prior hydrocarbon contamination, when a first step of dry ice cleaning is performed on the wafer surface in accordance with the invention. Although the ice jet cleaning may not completely remove surface contaminants, it is found that the sub-monolayer and monolayer processing regimes of the invention are rendered repeatable and predictable by a first ice jet cleaning step, contrary to conventional wisdom.

The sub-monolayer and monolayer HF vapor process regimes are characterized by an oxide etch rate on the order of about 5 nm/min, enabling a high degree of control of processing, e.g., to avoid undercutting of thick films when removing thin native oxide layers. In addition, positive charging of an oxide surface can be carried out in accordance with the invention to increase the sub-monolayer and monolayer etch rates while maintaining the benefits of these etch regimes. The selectivity of undensified TEOS oxide and thermal oxide to sub-monolayer and monolayer etching conditions is about 2–3:1, enabling the cleaning of sandwich structures without excessive undercutting of the TEOS film. The sub-monolayer and monolayer etch regimes are also found to not attack metal, e.g., aluminum or copper.

These advantages enable a process sequence, provided in accordance with the invention, in which a vacuum cluster tool is employed for via etching, contact cleaning of native oxide, and metal deposition. Referring to FIG. 19, there is shown such a configuration 100. Silicon wafers 102 are transferred between various vacuum chambers under vacuum via a robot 103 through a transfer chamber 105. The vacuum process chambers can include, e.g., a plasma etch chamber 107, ashing chamber 109, dry cleaning stations 111, 113, and a metal deposition chamber 115.

A wafer 102 having an oxide layer 104 formed upon it, can be processed to include a patterned photoresist layer 106 for defining a metal via. The wafer is then introduced to the cluster system and first processed in the plasma etch chamber 107 to etch the via pattern in the oxide layer. The wafer is then transferred to the ashing chamber 109 for removing the photoresist 106. At this point in the process, photoresist residue and metallic impurities 108 likely exist on the oxide layer 104 and a native oxide layer 110 likely exists on the surface of the silicon wafer. Such can be removed in situ by transferring the wafer to the dry cleaning chambers 111, 113 for a pretreatment of, e.g., UV exposure or ice jet cleaning, if desired and then removal of the residue and native oxide by an HF vapor process in the sub-monolayer or monolayer regime. Thereafter, the wafer is immediately transferred to the metal deposition chamber 115 for deposition of a metal layer 112 on a freshly cleaned wafer and oxide surface and via.

Referring to FIG. 20, in a further example of a vacuum cluster tool sequence provided in accordance with the invention, there is provided the ability to carry out metal line etching, polymeric residue removal, and interlayer dielectric deposition in situ under vacuum in one metal etch system 119. As with the system of FIG. 19, there is here enabled wafer transfer between various vacuum chambers under vacuum via a robot 103 through a transfer chamber 105. The vacuum process chambers can include, e.g., a plasma etch chamber 107, ashing chamber 109, dry cleaning stations 111, 113, and an interlayer dielectric deposition chamber 117.

A wafer 102 having, e.g., an oxide layer 120 has formed upon it a metal layer 122, e.g., a layer of aluminum. A layer of photoresist 124 is deposited and patterned corresponding to the metal line pattern desired for the metal layer 122. The wafer is introduced to the cluster system 119 and first processed in the plasma etch chamber 107 to pattern the metal layer 122. Typically, at the completion of the metal plasma etch, polymeric residue 124 is built up on the sidewalls of the etched metal lines. The wafer is then introduced through the cluster system to the ashing chamber 109 for removal of the photoresist. Even after this ashing step, polymeric sidewall residue is likely to remain.

At this point the wafer is transferred through the cluster system to the dry cleaning chamber 111 for a pretreatment of, e.g., UV exposure or ice jet cleaning, if desired, or Cl treatment. A hard polymer sidewall residue, typically consisting primarily of oxide, is often found to exist at this point. Removal of this residue is then carried out by transfer of the wafer to the second: dry cleaning chamber 113 for completion of an HF vapor process in the sub-monolayer or monolayer regime. Thereafter, the wafer is immediately transferred to the interlayer dielectric deposition chamber 117 for deposition of an interlayer dielectric over the patterned metal layer 122.

As can be recognized, the functionality of the two vacuum cluster systems just described can be integrated to provide a large scale vacuum system for metal deposition, patterning, and interlayer dielectric deposition. Both of the two vacuum systems, and an integrated system in particular, are cost effective, environmentally friendly, and highly efficient. The relatively high temperature operating conditions of the sub-monolayer and monolayer HF vapor process regimes of the invention enable completely dry cleaning processes for the cluster systems. These regimes are well-suited for a vacuum cluster configuration because they inhibit condensation conditions, thereby enabling rapid vacuum pumping and eliminating the potential for system component corrosion.

For many applications, including the vacuum cluster configurations just described, it can be preferred to operate an HF vapor process under sub-monolayer, rather than monolayer, conditions. The sub-monolayer process regime was demonstrated in the experimental examples given above to be less temperature-sensitive than the monolayer regime. This decreased temperature sensitivity results in a broadening of the allowable process conditions for the regime, leading to greater ease of process control. Lack of process control in the monolayer regime can result in process nonuniformity and the possible formation of localized multilayer regime regions, these having dramatically higher etch rates and the likely formation of surface pitting and roughness as well as post process residue. Small-sized and large-aspect ratio features are particular susceptible to such process artifacts. The controllable, slow-etch rate conditions of the sub-monolayer processing regime are found to inhibit these effects and therefore to be a more robust, reliable operation for manufacturing conditions. It is to be recognized, however, that the invention does not entirely dismiss monolayer and multilayer HF vapor processes. Particularly when combined with an initial surface charging or discharging step or an ice jet cleaning step, these processes can be successfully employed for a wide range of applications.

It is further to be recognized based on the discussion above that the HF vapor processes of the invention can be applied to a wide range of materials beyond the silicon, silicon dioxide and native silicon dioxide materials described. Other oxides and other semiconductor materials can be processed in accordance with the invention. Polymeric residue can be removed from metal and other lines, and carbon and other contamination, including residues, can be removed from substrate surfaces. The process conditions are not limited to semiconductor wafers; substrates of varying size and geometry can be accommodated by the processes of the invention.

This discussion highlights the wide range of applications of the HF vapor processes of the invention. Truly "all dry" etch and cleaning processes are provided, whereby semiconductor processing efficiency, repeatability, ease of control, and environmental friendliness are all enhanced.

It is recognized, of course, that those skilled in the art may make various modifications and additions to the HF vapor processes of the invention without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. A method for etching oxide on a semiconductor substrate, comprising the steps of:
   producing a positive electrical charge on the oxide; and
   subsequent to the positive electrical charge production, exposing the previously positively charged oxide on the substrate to hydrofluoric acid vapor and water vapor in a process chamber held at temperature and pressure conditions that are controlled to form on the substrate no more than a saturated monolayer of etch reactants and products produced by the vapor as the oxide is etched by the vapor.

2. A method for etching oxide on a semiconductor substrate, comprising the steps of:
   producing a positive electrical charge on the oxide; and
   subsequent to the positive electrical charge production, exposing the previously positively charged oxide on the substrate to hydrofluoric acid vapor and methanol vapor in a process chamber held at temperature and pressure conditions that are controlled to form on the substrate no more than a saturated monolayer of etch reactants and products produced by the vapor as the oxide is etched by the vapor.

3. A method for etching oxide on a semiconductor substrate, comprising the steps of:
   producing a positive electrical charge on the oxide; and
   subsequent to the positive electrical charge production, exposing the previously positively charged oxide on the substrate to hydrofluoric acid vapor and isopropyl alcohol vapor in a process chamber held at temperature and pressure conditions that are controlled to form on the substrate no more than a saturated monolayer of etch reactants and products produced by the vapor as the oxide is etched by the vapor.

4. The method of any of claims 1, 2, or 3 wherein the process chamber temperature and pressure conditions are controlled to form on the substrate no more than a sub-monolayer of etch reactants and products produced by the vapor as the oxide is etched by the vapor.

5. The method of any of clam 1, 2, or 3 wherein the positive electrical charge is produced on the oxide by exposure of the oxide to an electron beam.

6. The method of any of claims 1, 2, or 3 wherein the positive electrical charge is produced on the oxide by exposure of the oxide to ultraviolet light through an electrically-biased metallic screen.

7. The method of any of claims 1, 2, or 3 wherein the positive electrical charge is produced on the oxide by exposure of the oxide to a plasma environment wherein the substrate is capacitively biased by a negative-polarity DC voltage.

8. A method for etching oxide on a semiconductor substrate, comprising the steps of:
   producing a negative electrical charge on the oxide; and
   subsequent to the negative electrical charge production, exposing the previously negatively electrically charged oxide on the substrate to hydrofluoric acid vapor and water vapor in a process chamber held at temperature and pressure conditions that are controlled to form on the substrate no more than a multilayer of etch reactants and products produced by the vapor as the oxide is etched by the vapor.

9. The method of claim 8 wherein the negative electrical charge is produced on the oxide by exposure of the oxide to a plasma environment wherein the wherein the substrate is capacitively biased by a RF voltage.

10. The method of claim 8 wherein the negative electrical charge is produced on the oxide by exposure of the oxide to a plasma environment wherein the substrate is capacitively biased by a positive-polarity DC voltage.

* * * * *